(12) United States Patent
Javor et al.

(10) Patent No.: US 12,270,868 B2
(45) Date of Patent: Apr. 8, 2025

(54) MEMS MAGNETOMETER AND GRADIOMETER ARRAYS AND PATTERNS

(71) Applicant: Trustees of Boston University, Boston, MA (US)

(72) Inventors: Joshua Javor, Cambridge, MA (US); David Bishop, Brookline, MA (US)

(73) Assignee: Trustees of Boston University, Boston, MA (US)

( * ) Notice: Subject to any disclaimer, the term of this patent is extended or adjusted under 35 U.S.C. 154(b) by 0 days.

(21) Appl. No.: 18/665,825

(22) Filed: May 16, 2024

(65) Prior Publication Data

US 2024/0385261 A1 Nov. 21, 2024

Related U.S. Application Data

(60) Provisional application No. 63/466,779, filed on May 16, 2023.

(51) Int. Cl.
  *G01R 33/02* (2006.01)
  *G01R 33/00* (2006.01)
  *G01R 33/022* (2006.01)

(52) U.S. Cl.
  CPC ..... *G01R 33/0206* (2013.01); *G01R 33/0082* (2013.01); *G01R 33/022* (2013.01)

(58) Field of Classification Search
  CPC ............... G01R 33/00; G01R 33/0035; G01R 33/0023; G01R 33/0017; G01R 31/3191;
  (Continued)

(56) References Cited

U.S. PATENT DOCUMENTS

2005/0275497 A1* 12/2005 Ramadan ............ H01L 23/5227
  336/200
2011/0064502 A1* 3/2011 Hase ................. G03G 15/2028
  399/406
(Continued)

FOREIGN PATENT DOCUMENTS

WO WO-2022192682 A2 * 9/2022 ......... G01R 33/0286

OTHER PUBLICATIONS

International Search Report and Written Opinion mailed Aug. 27, 2024 for International Application No. PCT/US2024/029637 filed May 16, 2024 for Trustees of Boston University, 17 pages.

*Primary Examiner* — Jermele M Hollington
*Assistant Examiner* — Taqi R Nasir
(74) *Attorney, Agent, or Firm* — Cesari and McKenna, LLP; Steven M. Mills

(57) ABSTRACT

A system and method of measuring a magnetic field from a source. A plurality of sensors each include a plurality of sensing elements. A first sensing element is configured to detect an intensity of the magnetic field and a second sensing element is configured to directly measure a gradient of the magnetic field. A positioned is determined, with respect to the source, where a magnitude of the magnetic field in a first direction is greatest. An orientation of the sensors is determined in a three-dimensional pattern by arranging the sensors to emphasize sensing the magnetic field in the first direction. The sensors are oriented and positioned according to the position and orientation determined. The magnetic field is measured, in the first direction, using the sensors.

18 Claims, 24 Drawing Sheets

(58) Field of Classification Search
CPC ............ G01R 33/0358; G01R 33/0356; G01R 33/0206; G01R 33/0082; G01R 33/022; G01B 7/004; G01C 17/38; G06F 3/017; G06F 3/0346; G06F 3/012; H01L 39/223
See application file for complete search history.

(56) References Cited

U.S. PATENT DOCUMENTS

| | | | |
|---|---|---|---|
| 2012/0220893 A1* | 8/2012 | Benzel | A61B 5/6844 600/553 |
| 2013/0030330 A1 | 1/2013 | Wall | |
| 2018/0210039 A1* | 7/2018 | Shalev | G01V 3/081 |
| 2018/0210089 A1 | 7/2018 | Wang et al. | |
| 2020/0018589 A1* | 1/2020 | Ausserlechner | G01B 7/30 |
| 2022/0291300 A1 | 9/2022 | Javor et al. | |

* cited by examiner

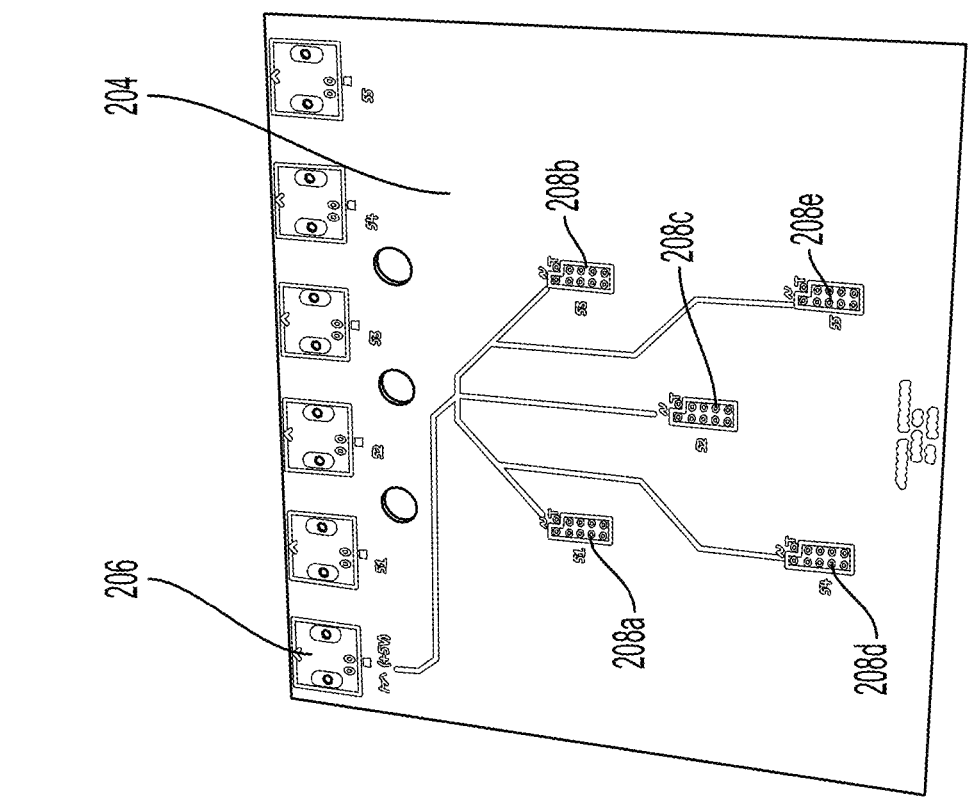
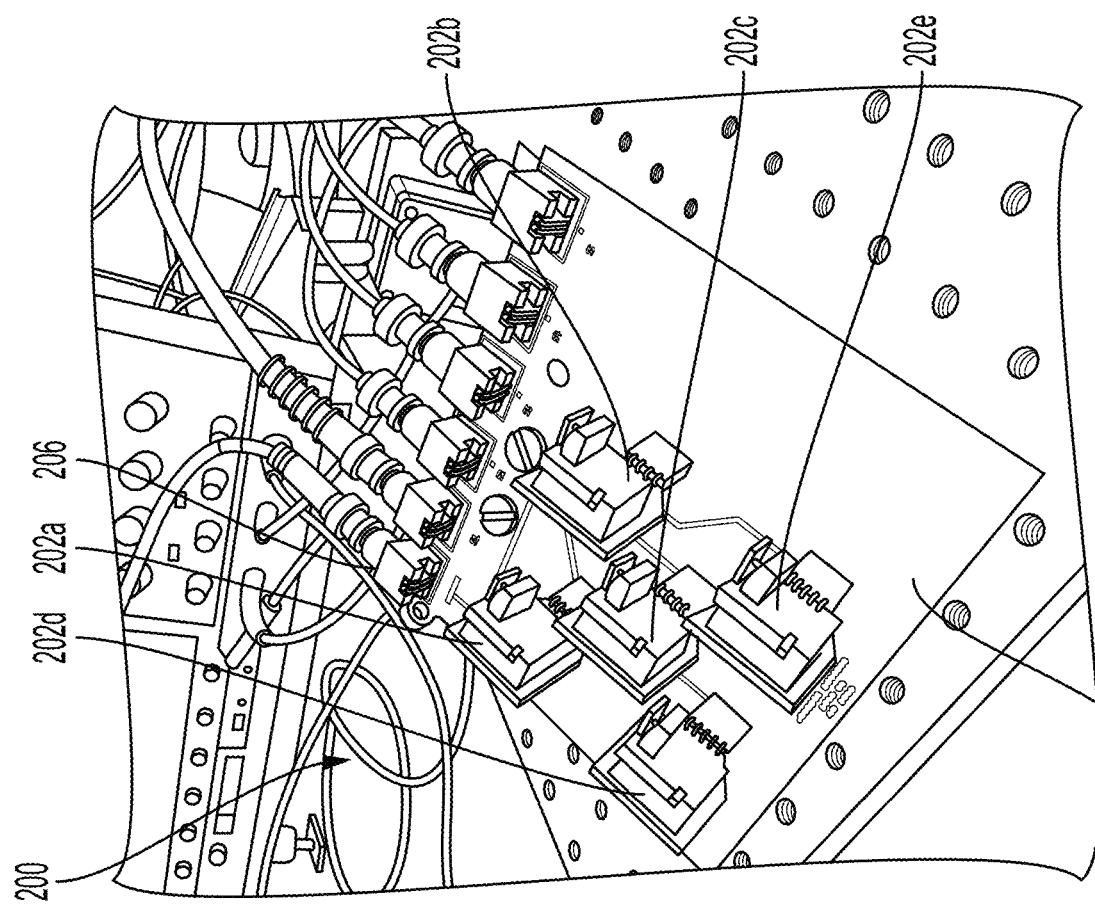

Bx, By, Bz dBx/dx dBy,dy, dBz,dz dBx,dy, dBx,dz, dBy/dx, dBy/dz, dBz/dx, dBz,dy d( dBx/dx dBy,dy, dBz,dz
dBx,dy dBx,dz, dBy/dx, dBy/dz, dBz/dx, dBz,dy)/dx d( dBx/dx dBy,dy, dBz,dz
dBx,dy dBx,dz, dBy/dx, dBy/dz, dBz/dx, dBz,dy)/dy d( dBx/dx dBy,dy, dBz,dz
dBx,dy dBx,dz, dBy/dx, dBy/dz, dBz/dx, dBz,dy)/dz

_US 12,270,868 B2_

MEMS MAGNETOMETER AND GRADIOMETER ARRAYS AND PATTERNS

CROSS REFERENCE TO RELATED APPLICATIONS

This application claims priority to and the benefit of U.S. Provisional Patent Application No. 63/466,779, filed on May 16, 2023, and entitled "MEMS MAGNETOMETER AND GRADIOMETER ARRAYS AND USES THEREOF", the contents of which are incorporated herein by reference as though fully set forth herein.

GOVERNMENT SUPPORT

This invention was made with government support under contract 1647837, awarded by the U.S. National Science Foundation. The government has certain rights in this invention.

FIELD OF THE TECHNOLOGY

The subject disclosure relates to sensing systems, and more particularly, to sensor patterns, and more particularly to sensors which including sensing elements configured to measure magnetic fields and gradients.

BACKGROUND OF THE TECHNOLOGY

Existing magnetic sensors detect magnetic intensity, which means they are sensitive to all forms of interference, such as the Earth's magnetic field and expansive electromagnetic infrastructure. A large span of techniques have been developed to increase immunity to interference, such as differential sensing with multiple sensors, cryogenic cooling, large magnetically shielded rooms, and more.

An example of a particular problem is the detection of magnetic fields of the heart. Products with FDA clearance are already emerging in this space, improving triage of patients with chest pain and accuracy of diagnosis. Yet, the technology is greatly limited by the necessity for large instruments with magnetic shielding and specialized facilities.

SUMMARY OF THE TECHNOLOGY

In light of the needs described above, disclosed herein is a system and methodology for detection of sensitive magnetic fields with enhanced immunity from magnetic interference. The subject disclosure enables the measurement of sensitive magnetic fields at a single point, with a single sensor, with increased immunity to magnetic interference. This is achieved by the direct detection of spatial derivatives of the magnetic field, where a sensor becomes more sensitive to objects in close proximity, and far less sensitive to sources that are farther away. Further, the technology disclosed herein enables miniaturized magnetic sensing in portable and wearable equipment, democratizing such technology.

In some cases, the technology disclosed herein can be implemented in an array or pattern of magnetic sensing elements, which could be a compensation array measuring 3D interference for a different 2D imager. In other cases, the array or pattern could form a sphere, hemisphere, or other enclosure where the object to be characterized could be inside, as discussed in more detail herein.

BRIEF DESCRIPTION OF THE DRAWINGS

So that those having ordinary skill in the art to which the disclosed system pertains will more readily understand how to make and use the same, reference may be had to the following drawings.

FIG. 2a is a perspective view of an exemplary MEMs magnetometer array in accordance with the subject technology.

FIG. 2b is perspective view of an exemplary PCB for the array of FIG. 2a in accordance with the subject technology.

FIG. 3b is a graph of sensor output from the MEMs magnetometer of FIG. 3a.

FIG. 3c is a magnetic image graph of the sensor output from FIG. 3a.

FIG. 3e is another graph of sensor output from the MEMs magnetometer of FIG. 3a.

FIG. 3f is another magnetic image graph of the sensor output from FIG. 3a.

FIG. 4b is an exemplary diagram of a torso, showing the location of certain magnetic forces during the experimental setup of FIG. 4a.

FIG. 4c is a graph of sensor data from the array of FIG. 4a.

FIG. 4d is a graph of post-processed sensor data from the array of FIG. 4a.

FIG. 4e is a graph of magnetic fields and distance from the individual's chest during the experimental setup of FIG. 4a.

DETAILED DESCRIPTION

Figure 1:
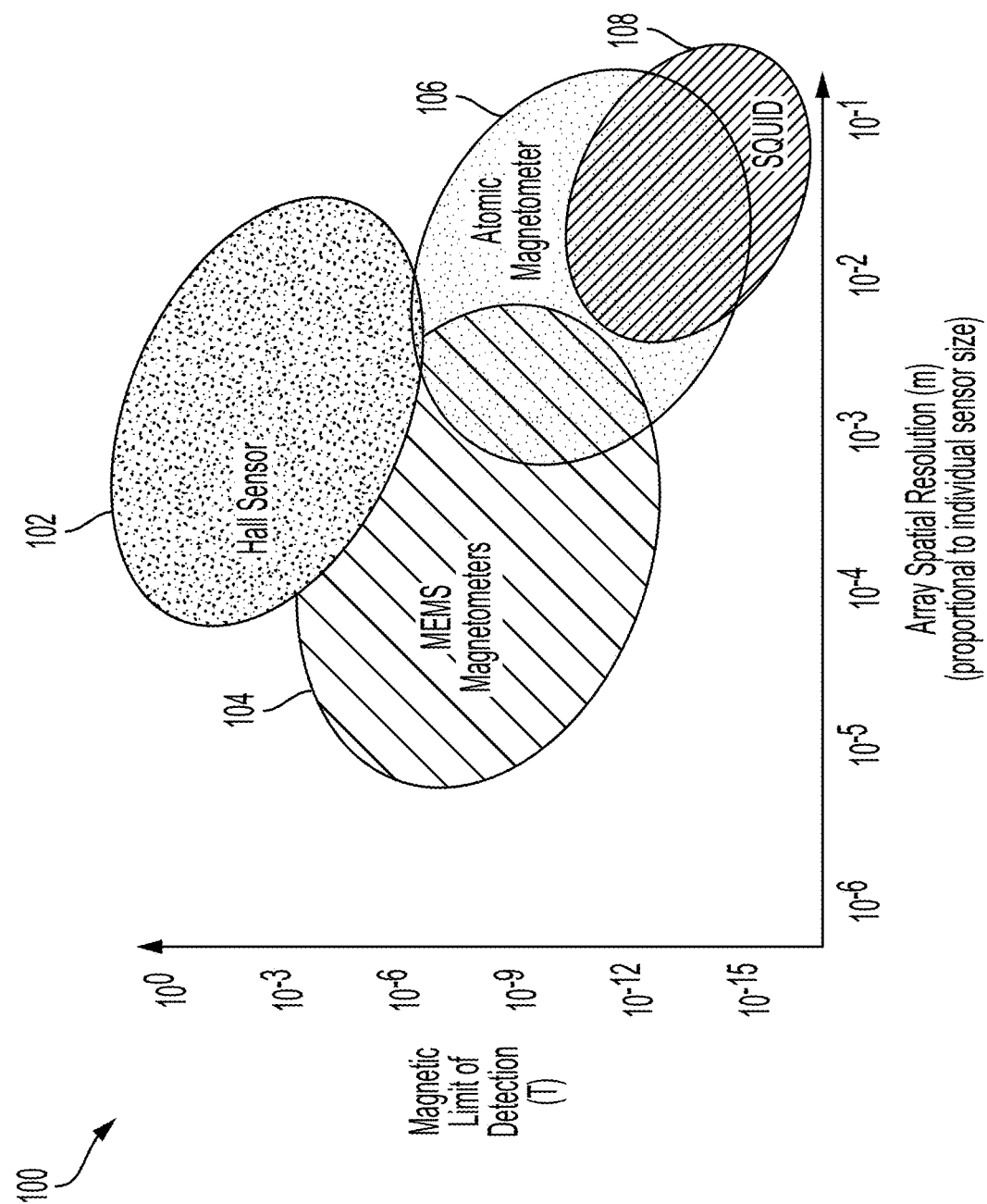
FIG. 1 is a graph showing magnetic limit of detection and spatial resolution of various sensor types.

The subject technology overcomes many of the prior art problems associated with magnetic sensors and arrays of sensors. The advantages, and other features of the systems and methods disclosed herein, will become more readily apparent to those having ordinary skill in the art from the following detailed description of certain preferred embodiments taken in conjunction with the drawings which set forth representative embodiments of the present invention.

Like reference numerals are used herein to denote like parts. Further, words denoting orientation such as "upper", "lower", "distal", and "proximate" are merely used to help describe the location of components with respect to one another. For example, an "upper" surface of a part is merely meant to describe a surface that is separate from the "lower" surface of that same part. No words denoting orientation are used to describe an absolute orientation (i.e. where an "upper" part must always at a higher elevation).

The present disclosure describes various novel combinations and forms of MEMS magnetic sensors that may be desired for the accomplishment of a magnetic imaging or sensing task. Additionally, methodology related to cardiac imaging with broader applications is disclosed herein. This methodology is supported by unique magnetocardiographic data on a human heart gathered via atomic magnetometer data.

Referring now to FIG. 1, an illustrative Ashby plot 100 shows the magnetic limit of detection and array spatial resolution of various types of sensors. In particular, the graph shows data points for a hall sensor 102, a MEMs magnetometer 104, an atomic magnetometer 106, and a SQUID 108. The subject disclosure enables technology within this design space at the intersection of spatial array density and sensor resolution.

Referring now to FIGS. 2a-2b, an exemplary MEMs magnetometer array 200 in accordance with the subject technology is shown. The exemplary design shown uses five separate sensing elements (202a-202e, generally 202) in a pentagonal square-centered lattice. For some applications, the array 200 can include the four corner sensing elements, 202a, 202b, 202d, 202e, in a square shape, with the central sensing element 202c removed. Each sensing element 202 is configured to detect a magnetic field and output a corresponding voltage. The sensing elements 202 are electrically connected to a processing board 204 (e.g. a PCB) at respective connectors 208-208c (generally 208). The processing board 204 provides the signal from the sensors to an output 206, which can be connected to external processor or the like (not distinctly shown). In other cases, the processing board itself can include the capability to convert the sensor signal into an understandable output value. Based on the output, a magnetic image can be produced from the sensed magnetic field, which can come from a nearby object, for example.

It should be understood that other arrangements and shapes of sensors, and arrays using different amounts of sensors, could also be used, in accordance with the subject disclosure. For example, in some instances, an array can be formed from nine sensing elements in an equally spaced 3×3 grid. While the examples shown herein provide an effective imaging device, the array may be further optimized for spatial density with sensors that are more tightly packed utilizing custom-design sensor packaging and sockets/surface mounts.

Figure 3A:
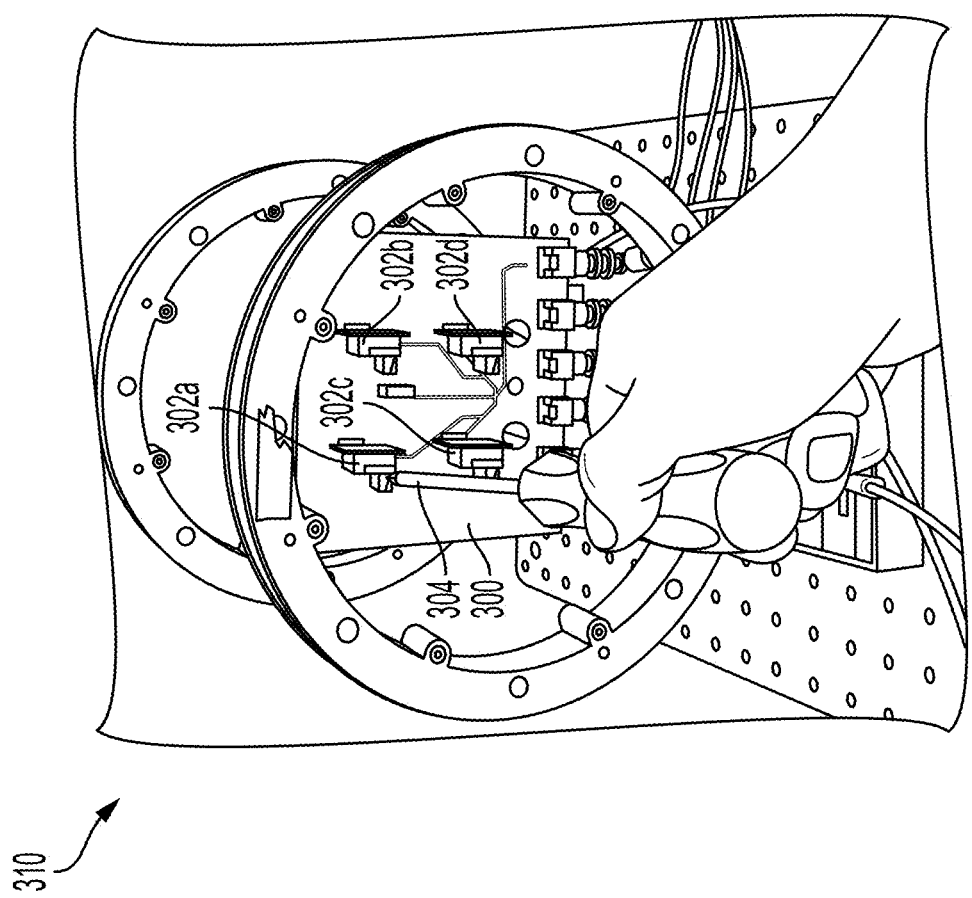
FIG. 3a is a MEMs magnetometer array being used for magnetic imaging in accordance with the subject technology.
Figure 3B:
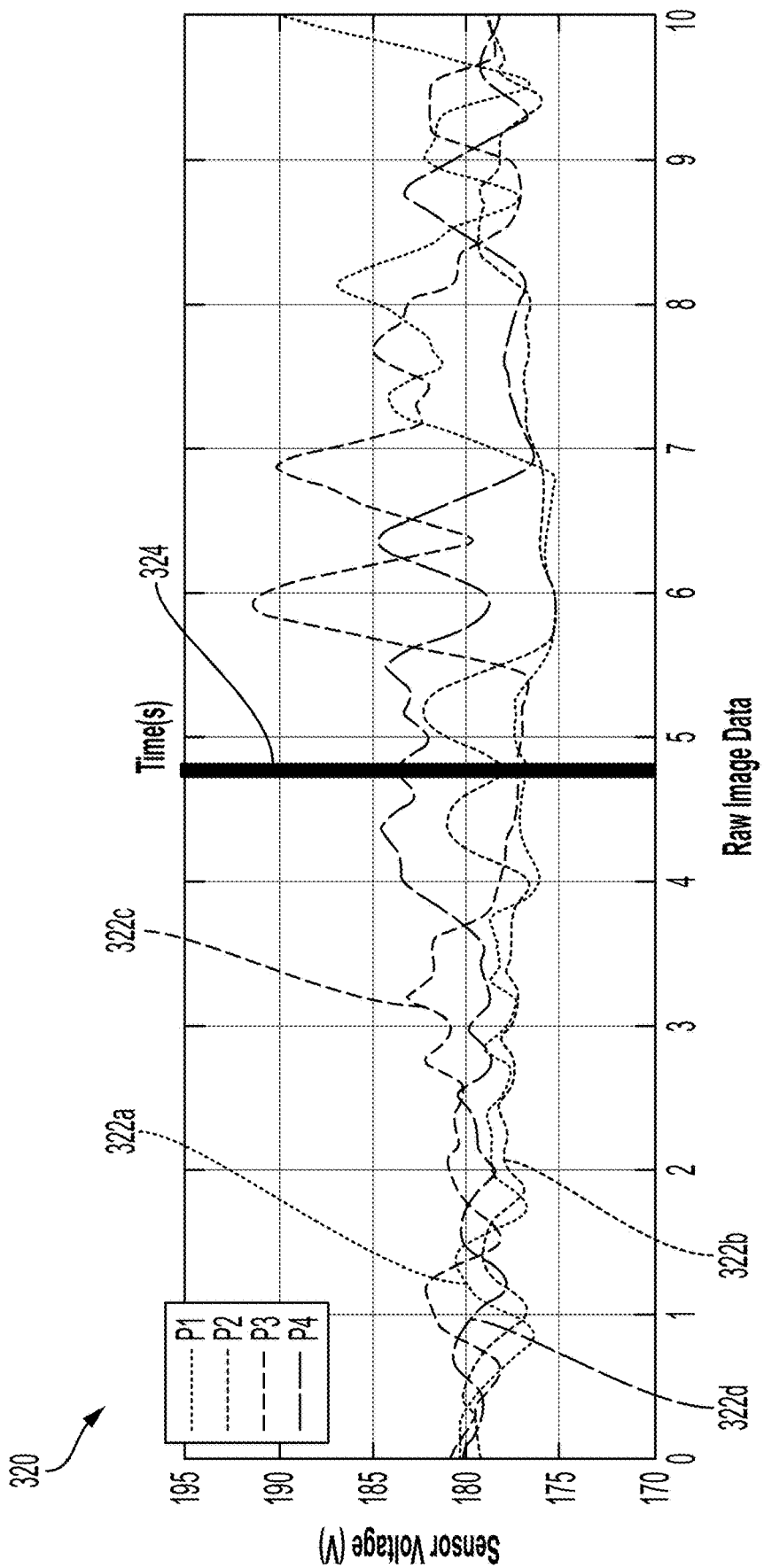
Figure 3C:
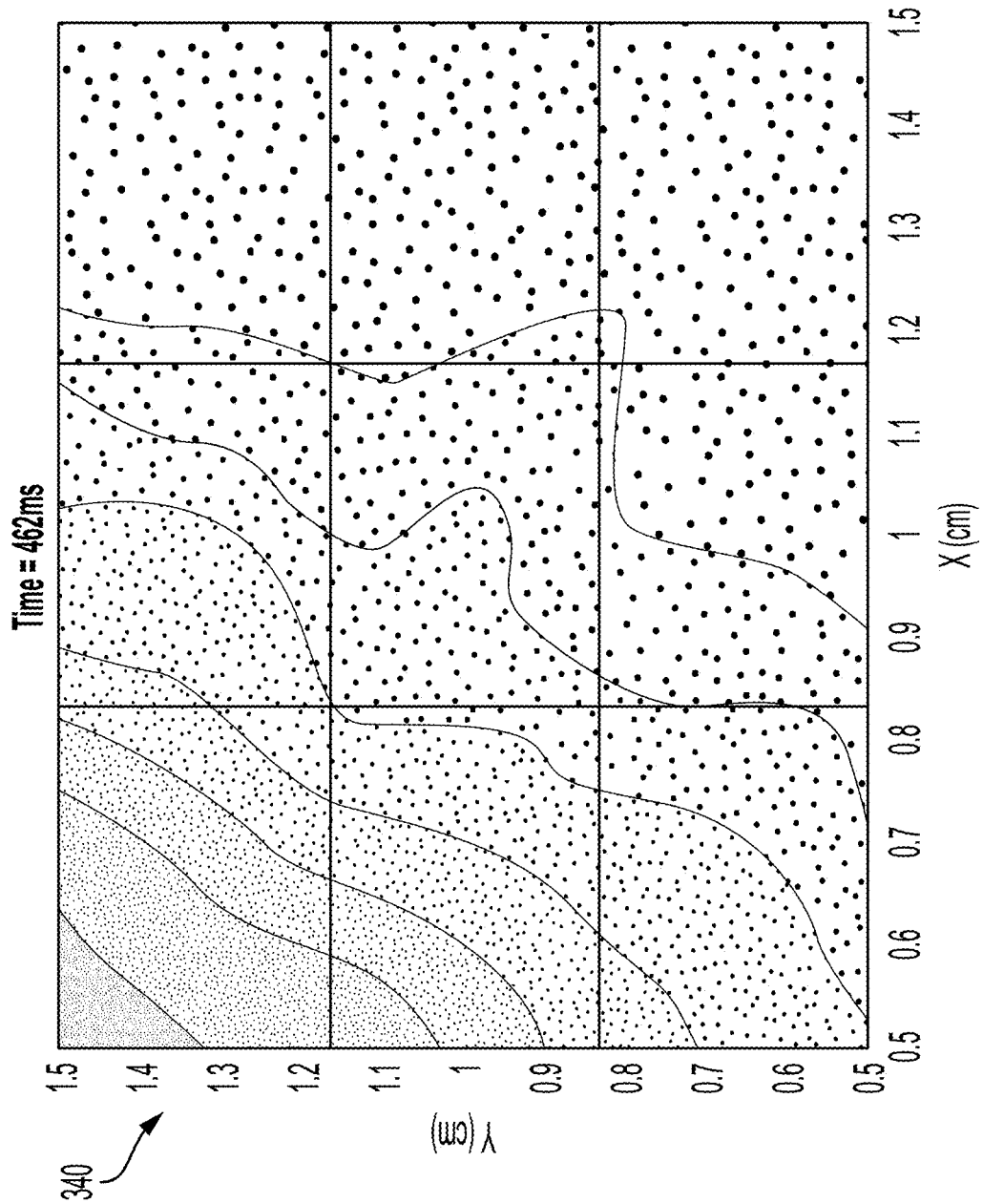
Figure 3D:
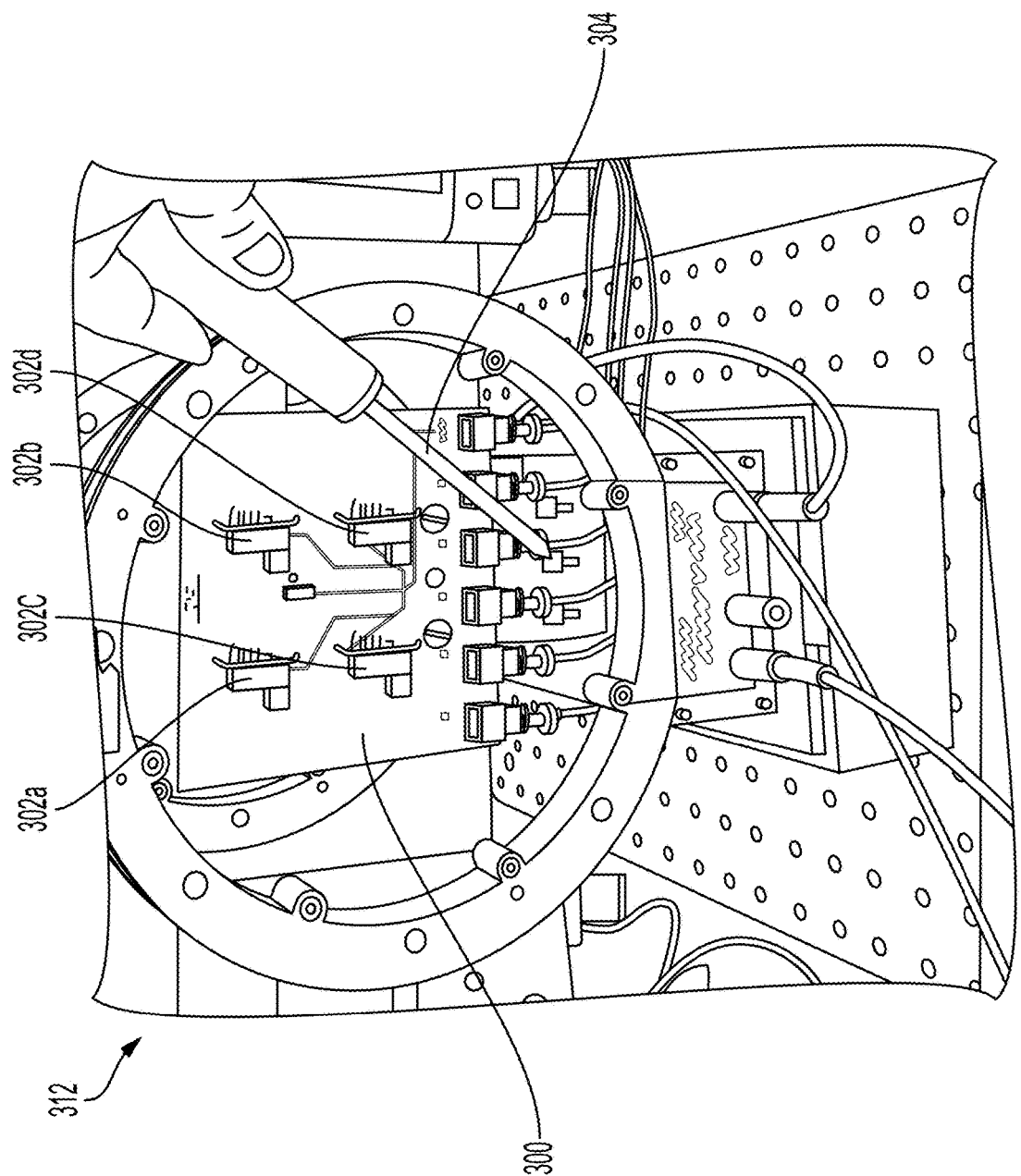
FIG. 3d is another view of the MEMS magnetometer array of FIG. 3a being used for magnetic imaging in accordance with the subject technology.

Referring now to FIGS. 3a-3f, the MEMs magnetometer array is shown being used for "magnetic imaging." The term magnetic imaging is used herein to describe generating an image based on the relative magnitude of a sensor output across an image plane. The array 300 is similar to the array 200, except as otherwise shown and described herein. In particular, the array 300 utilizes four sensing elements 302a-302d (generally 302), arranged in a square pattern. As shown in FIGS. 3a and 3d, a ferromagnetic object 304 (not magnetized, but enough to warp a magnetic field) is presented to the array 300 about one foot away. In the example shown, the ferromagnetic object 304 is a hex screwdriver. The object 304 is moved at a distance of about one foot from the array 300 to induce a change in magnetic field on the sensors. The image 310 of FIG. 3a represents the position of the object 304 about 462 milliseconds after the start of moving the object 304, while the image 312 of FIG. 3d shows the position of the object 304 at about 16 seconds. In particular, the denser areas represent the positions of greater sensor feedback, and therefore the areas where the screwdriver is closer.

Figure 3E:
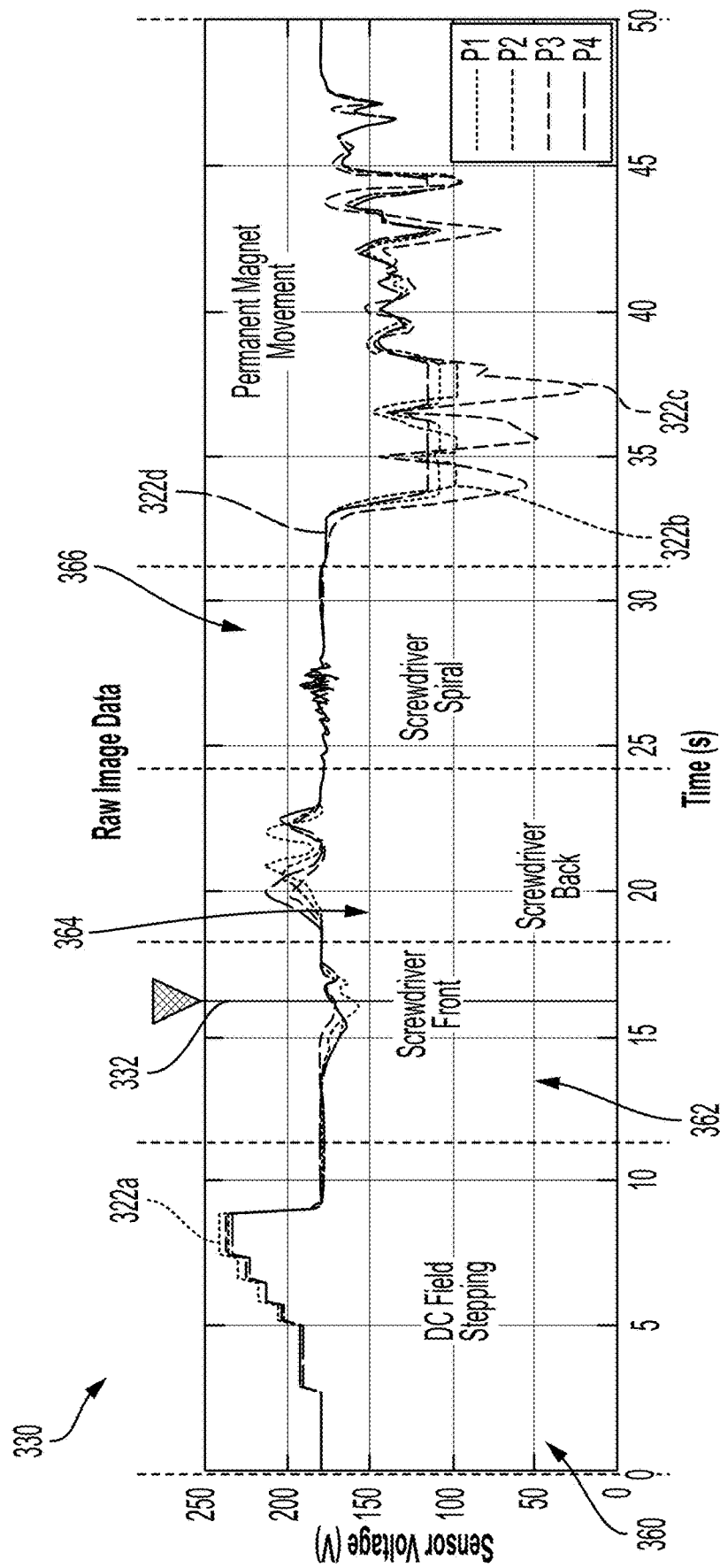
Figure 3F:
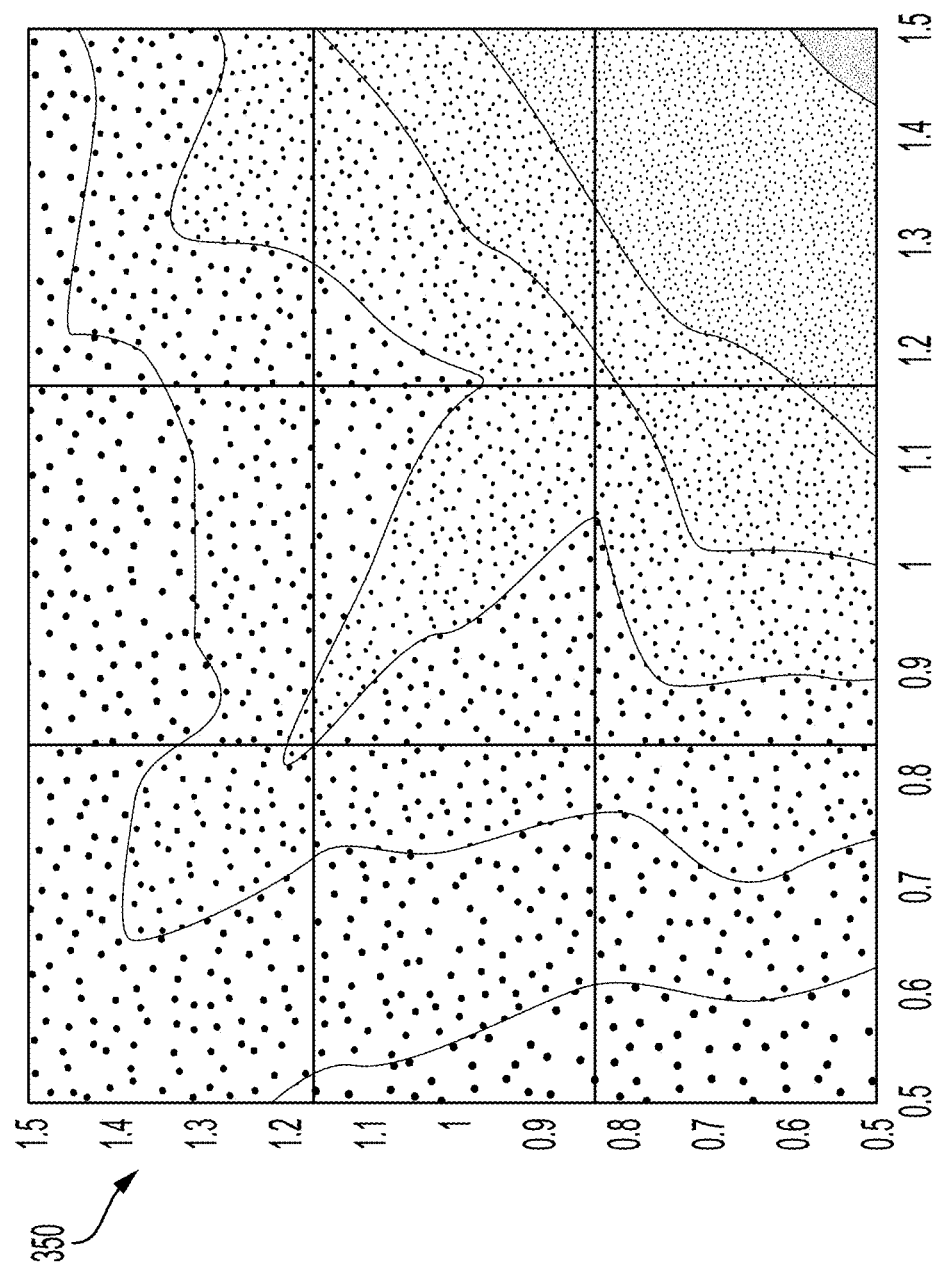

The graphs 320, 330 of FIGS. 3b and 3e, respectively, represent the raw magnetic sensor data over time for various demonstrated types of movements. Each graph line 322a-322d represents the output from one of the sensing elements 302. Graph 320 shows output from the sensing elements 302 over a shorter, initial time period, while graph 330 shows data over a larger time period. In graph 320, the time corresponding to the position shown in FIG. 3a is marked by line 324, while in graph 330, the position shown in FIG. 3d is marked by line 332.

During the process shown, we first demonstrate stepping of a DC magnetic field where an electromagnetic coil produces increasing magnetic field intensities and all sensing elements react uniformly (region 360). The ferromagnetic object 304 is then moved in the plane of the magnet array 300 on the front side during time period represented by region 362, and then on the back side of the array 300 as seen in the time period represented by region 364. We then turned the object 304 perpendicular to the array 300 and drew spiral shapes in the air, which demonstrates different phases in the array 300, corresponding to region 366. Finally, we moved a permanent magnet from several feet away from the sensing elements 302, where one can observe some sensing elements 302 saturating since they are so sensitive to magnetic fields.

The images 340, 350 (FIGS. 3c, 3f) represent an interpolated and smoothed processing of the magnetic sensor array 300 data. These show an intuitive image, on an X-Y plane, of the location of the object 304 as well as information about its proximity (intensity of signals). In particular, the areas showing a greater density are correlated to a higher sensor output due to proximity of the magnetic object. We note that all of this is accomplished in a magnetically noisy laboratory environment at room temperature, something that is rare or impossible for existing sensitive magnetic sensors today.

Figure 4B:
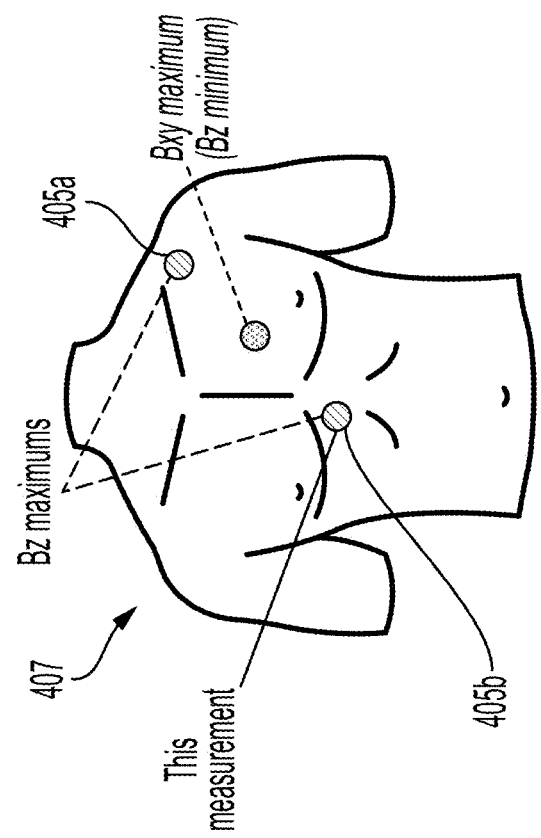
Figure 4A:
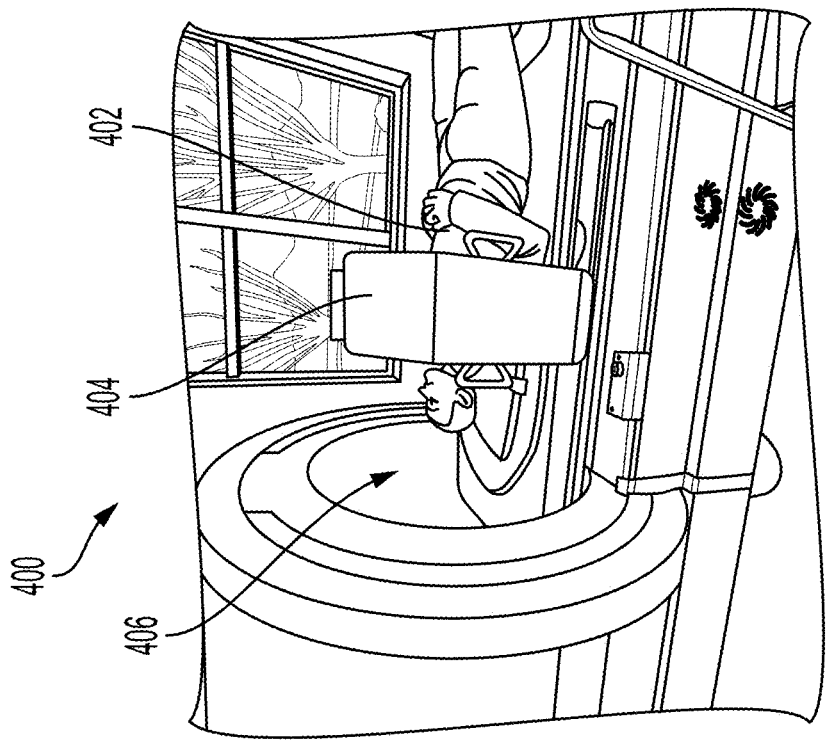
FIG. 4a is an exemplary experimental setup for testing magnetic forces related to an individual using a sensor array in accordance with the subject technology.
Figure 4D:
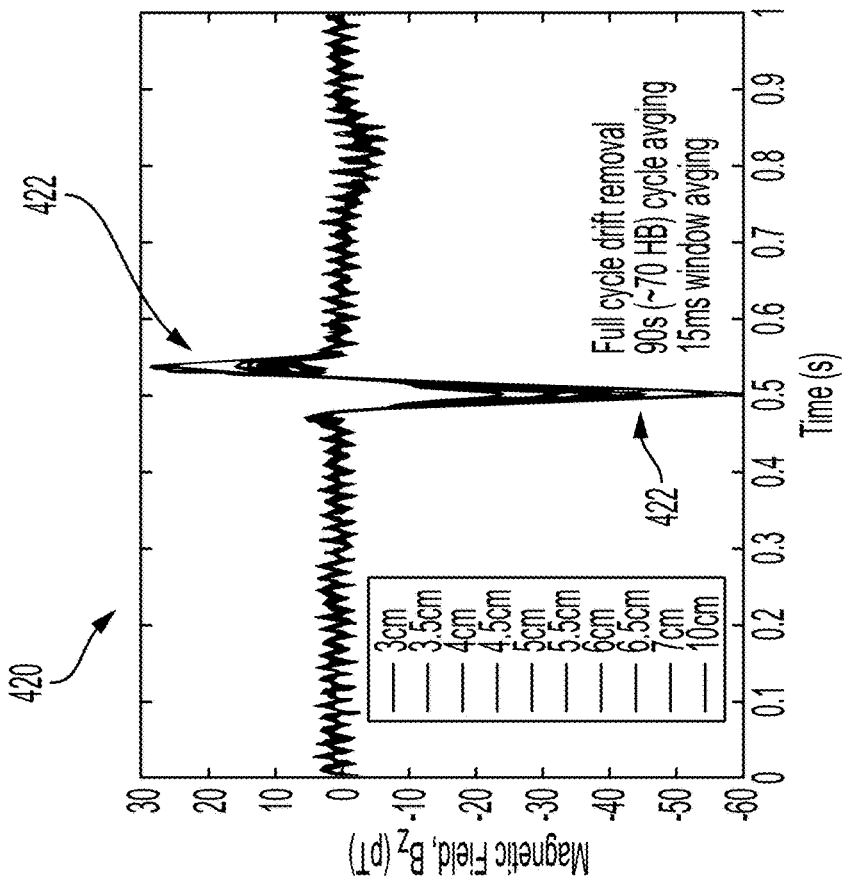
Figure 4C:
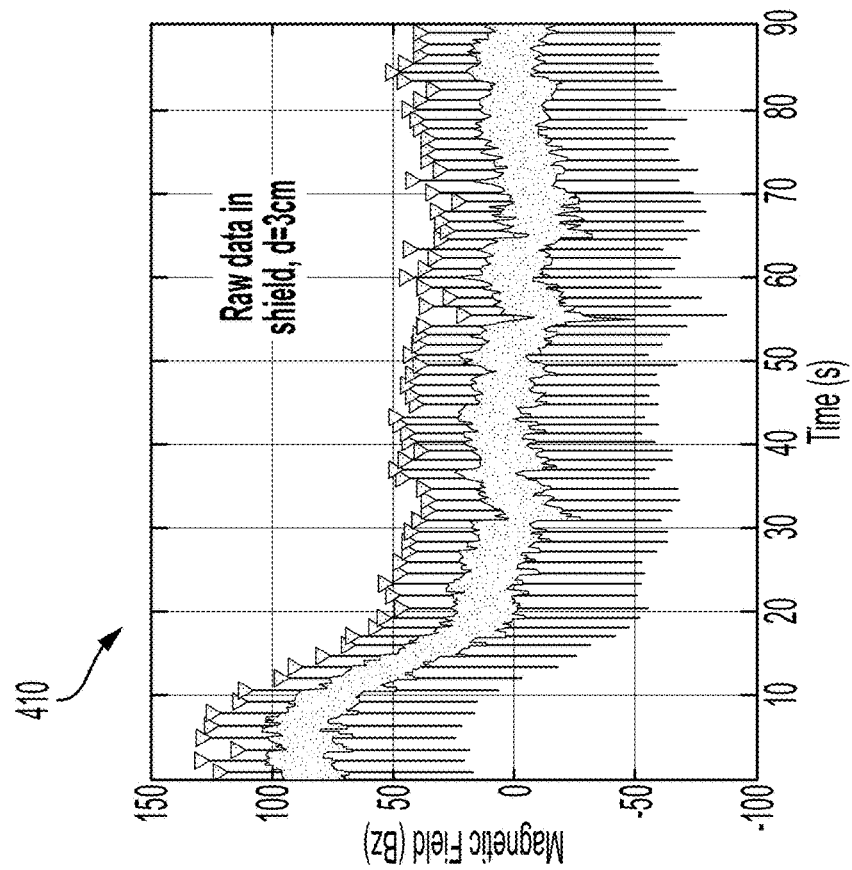
Figure 4E:
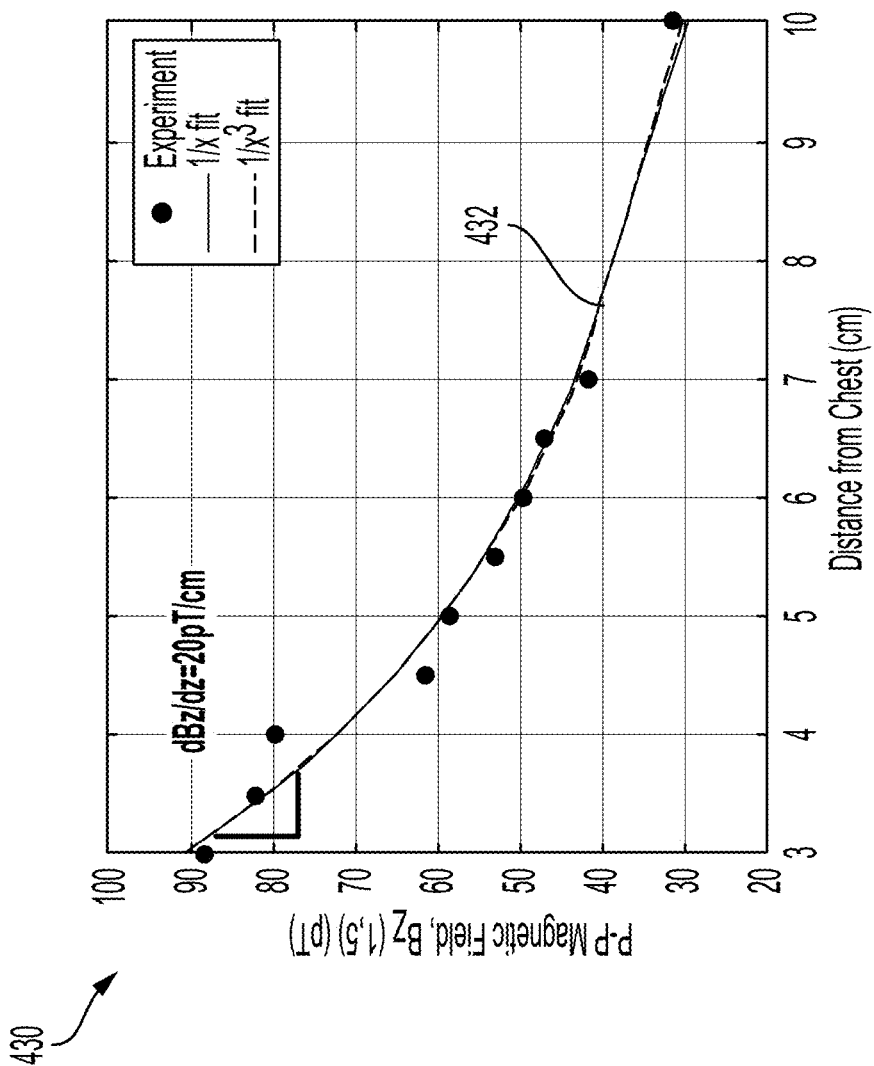
Figure 5B:
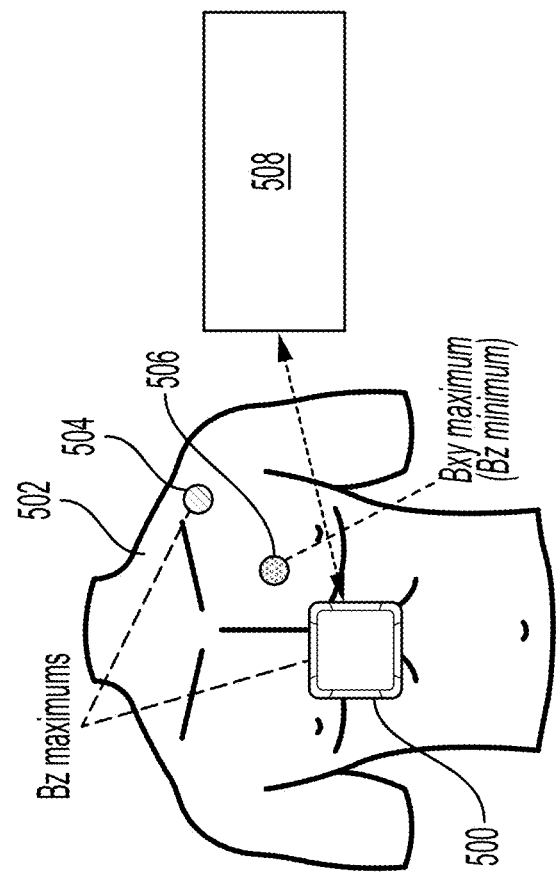
FIGS. 5a-5e are exemplary diagrams of torsos, showing possible sensor locations and forces in accordance with the subject technology.
Figure 5A:
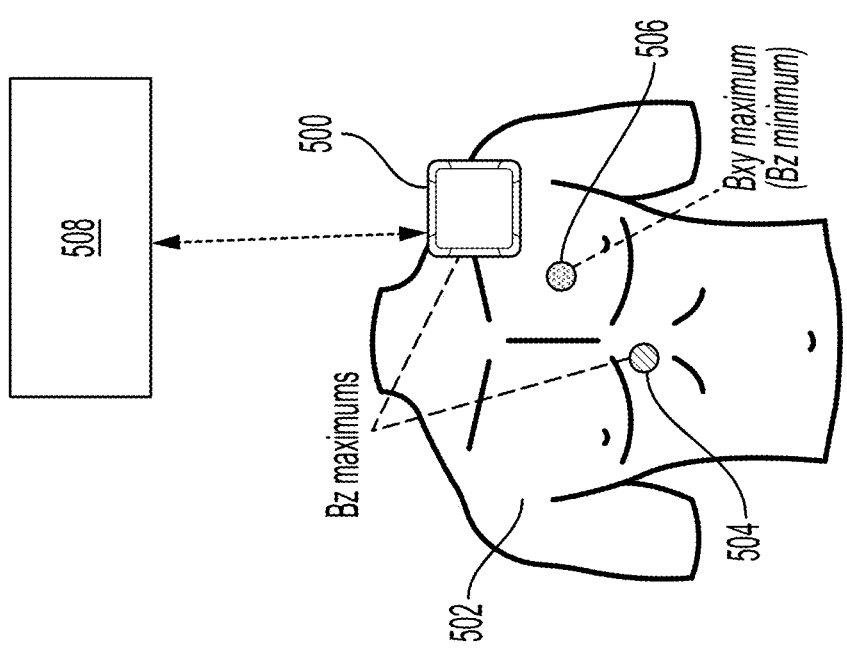
Figure 5C:
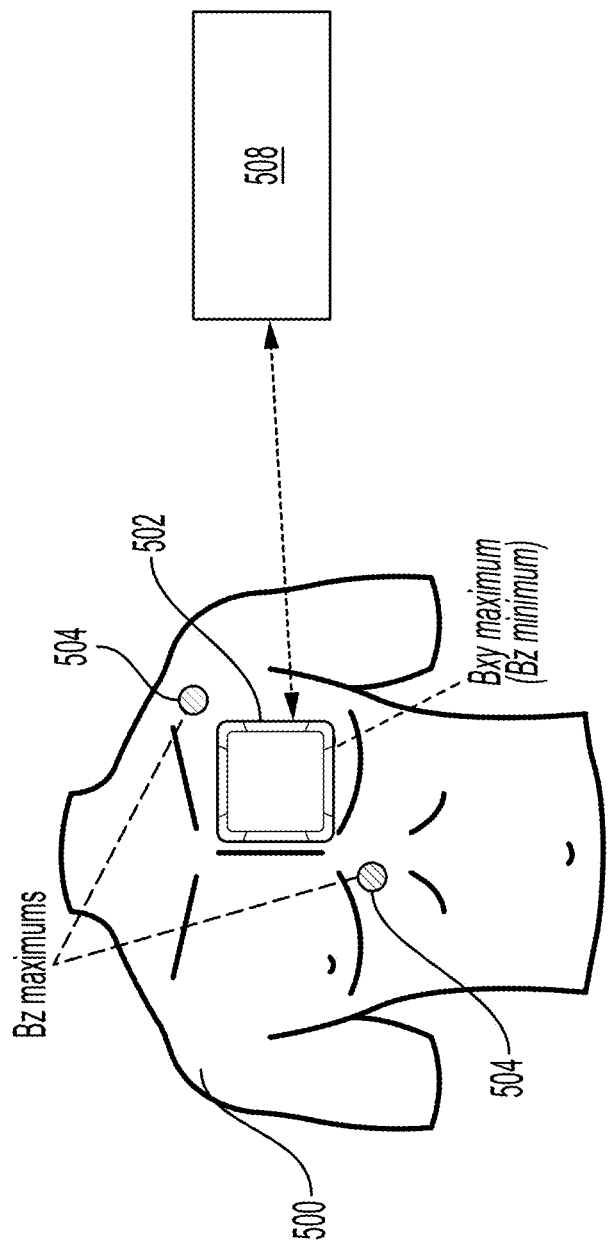
Figure 5E:
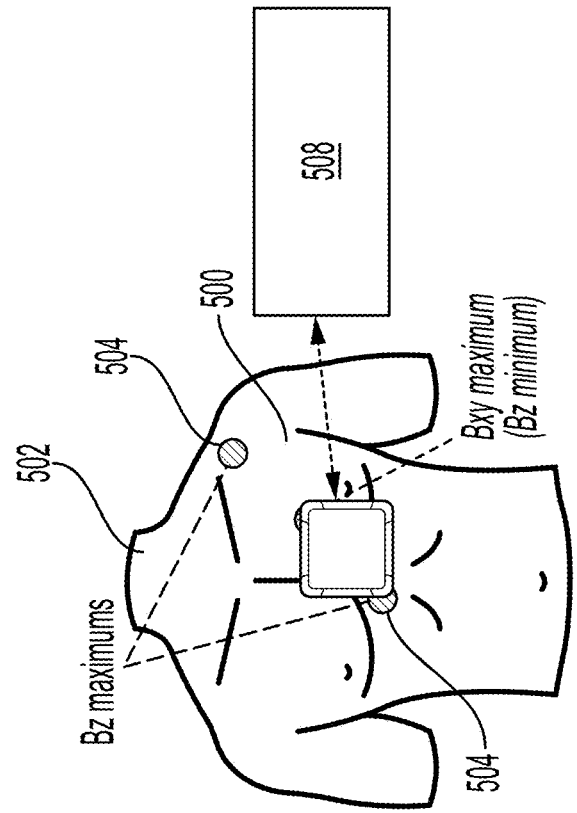
Figure 5D:
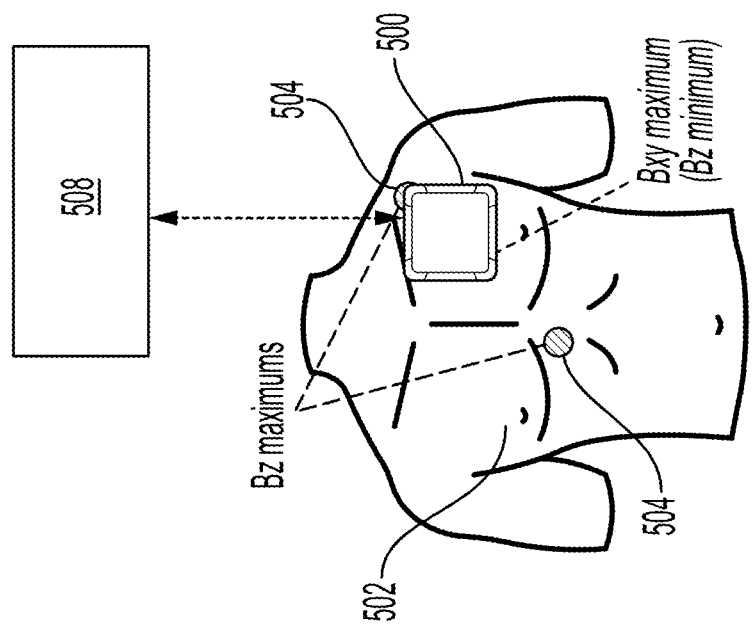

Referring now to FIGS. 4a-4c, an experiment was carried out using a magnetometer pattern 404 in accordance with the subject technology. The experiment was carried out using a pattern of 64 sensing elements. In FIG. 4a, image 400 shows an individual 402 in the middle of a number of sensing elements forming a sensor pattern 404. The pattern 404 includes 64 sensing elements spanning from the individual's left shoulder to the bottom of the right side of their ribs. The large magnetic shield opening 406 is shown to the left, within the center of which the individual 402 was positioned to collect data (about 5 ft the left in the image 400 as shown). Data is then collected from the sensor pattern 404. FIG. 4c shows a graph 410 of data from the best performing sensing element in the sensor pattern 404 over a 90 second interval, in the position relative to the individual's heart, which produced the maximum magnetic field. FIG. 4b shows the position of that sensing element relative to the individual's torso 407. In particular, the magnetic field in one direction (Bz) was determined to be greatest at two locations 405a, 405b. A sensor measurement was taken at a location 405b on the user's torso 407, relative to a user's heart, where the magnetic field Bz was greatest. The spikes shown on graph 410 are identifying the individual's magnetic heart beats with no post-processing. The drift is likely due to thermal effects as the sensor pattern 404 operates quite hot. In some embodiments, the sensor can include a temperature sensor and adjustments may be made to account for these thermal effects.

FIG. 4d is a graph of post-processed sensor data, with graph lines 422 including a line representing data from the 90 second data interval shown in graph 410. The ~70 peaks are averaged to present one peak with higher signal-to-noise ratio (SNR). This is then repeated at several larger distances from the individual's heart (represented by the other graph lines 422 shown), and the total magnitude is tracked over space. In the example given, the graph lines 422 represent a range of distances from 3 cm to 7 cm, in half centimeter intervals, and then a final measurement at 10 cm. From this data, we extrapolate the magnetic gradient and higher order gradients from the heart as well as their specific location relative to the body/heart. Graph 430 of FIG. 4c is a plot of this trend, with each datapoint representing a readout from one sensing element to form trend line 432. From the graph 430, it can be seen that an appreciable magnetic gradient exists as far away from my chest as 10 cm. This data will vary in different patients, but the trend is quite informative.

Referring now to FIGS. 5a-5f represents exemplary locations where a sensor 500, in accordance with the subject technology, might be positioned on a torso 502 of an individual. It should be understood that while the term "array" is used at times herein, the arrangement of sensing elements described herein is not always two-dimensional. Often, the subject technology involves positioning and orienting of sensors and/or sensing elements in three-dimensional space, and therefore is alternatively referred to as a "pattern" of sensors. Likewise it should be understood that the sensor 500 can include a pattern of sensors and/or sensing elements in accordance with the teachings herein. In the examples shown in FIGS. 5a-5f, areas of Bz maximum (504) and of Bxy minimum (506) have been identified, as can be seen on FIGS. 5a-5b. The sensor 500 is shown throughout FIG. 5a-5f, in different locations where certain magnetic field measurements of emphasized, as discussed in more detail below.

The sensor 500 combines the advantages of a MEMS magnetometer cost and size profile with unique learnings about biomagnetic cardiac fields. The sensor 500 is configured as a wearable magnetic monitor that sits in any of these configurations. Rather than identify all cardiac conditions, the sensor 500 can be configured to identify problems associated with specific readings or trends which are representative of common problems. Over time, and as more data is gathered, the sensor 500 can be improved to identify additional problems. The field maximum intensities and gradients are noted with a corresponding processing device 508. The device 508 can be a remote device which communicates with the sensor 500 using known communication methods (e.g. Bluetooth, Wi-fi, cellular, or other RF communication), and processes data using known computing techniques. In general, the device 508 will have processing capabilities at least sufficient to receive data from the sensor 500 and calculate whether the data obtained is representative of certain known conditions. In some examples, the device 508 can determine the measured magnetic field from data from the sensor 500 and calculate a summary of conditions based upon known medical information for presentation to a physician, patient, or other user.

The sensor 500 is exemplary only and provides an example of a smaller wearable arrangement of sensing elements. In other embodiments, a larger sensor may be used, covering the whole torso, that still utilizes the following relationships: Z intensity and gradient sensing elements in one location; X and Y sensing elements in another; and a combination of dX/dY sensing elements in yet another. Such an arrangement will effectively allow for the performance of MCG measurements in an ambient environment.

Referring now to FIGS. 6-11b, additional sensor arrangements, in accordance with the subject technology, are shown. These are exemplary combinations of sensor type, arrangement, and orientation that might be useful for performing various imaging and sensing tasks. The sensors disclosed herein can be used to sense a number of magnetic fields and/or magnetic field gradients. Further, the orientation of sensing elements within the sensor(s) and/or location of the sensor(s) with respect to an object being measured, can be modified to emphasize a particular aspect of the magnetic field being measured. List 601 represents possible magnetic fields and gradients that can be emphasized using the sensor patterns described herein.

Figure 6:
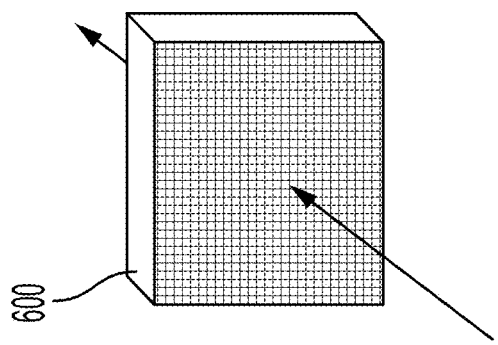
FIG. 6 is a perspective view of an exemplary sensor in accordance with the subject technology.
Figure 7A:
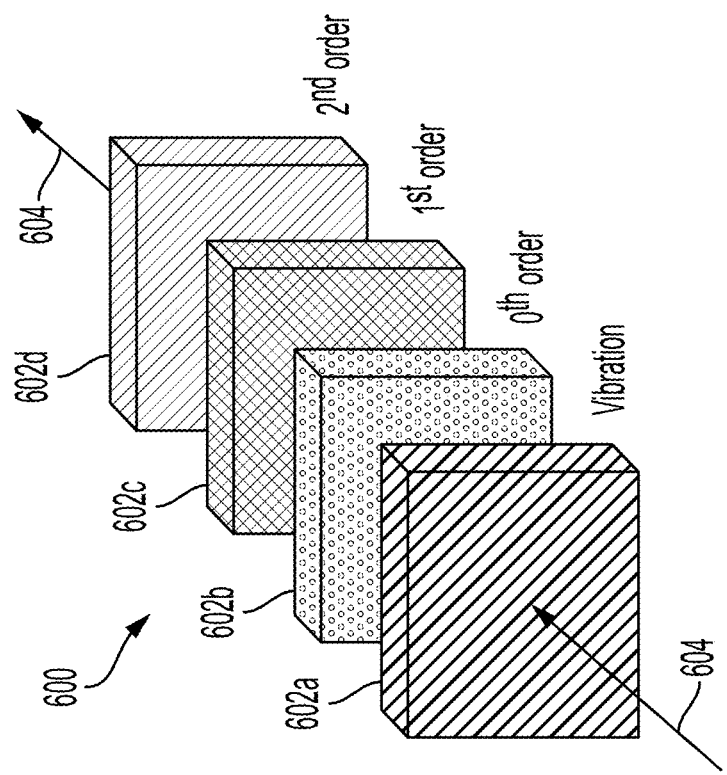
FIGS. 7a-7b are perspective views of exemplary layouts of sensing elements in a sensor in accordance with the subject technology.
Figure 7B:
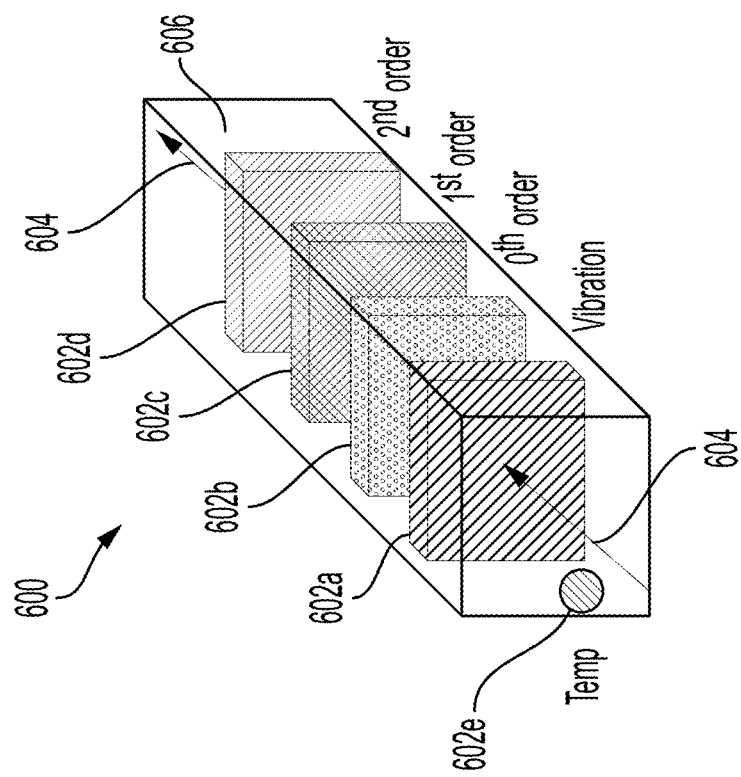

FIGS. 6-7b show an exemplary sensor 600 which can be used as part of a system or method as described herein. For simplicity, the sensor 600 is shown as a cuboid shape in FIG. 6. As shown in FIGS. 7a-7b, each sensor 600 can be made up of numerous individual sensing elements 602a-602e (generally 602) which are each calibrated to measure a specific influence on the sensor 600. In the example shown, the sensing elements include three sensing elements 602b, 602c, 602d configured to measure the influence of a magnetic field along a direction of the magnetic field axis 604. A first sensing element 602b is configured to detect an intensity of the magnetic field along the axis 604.

The sensor 600 can also include a number of gradient sensing elements. Gradient sensing elements measure a change in magnetic field directly. Gradient sensing elements can be configured, for example, with one or more magnets being acted on by the magnetic field being sensed. For example, a first order gradient sensing element can measure the movement of a magnet caused by the magnetic field. For a second order gradient sensing element, two magnets may be arranged in a "back-to-back" configuration with like poles being adjacent, such that the combined structure experiences a force proportional to a second order gradient. Additional magnets can be included for higher order gradient sensing.

In the example of the sensor 600, a gradient sensing element 602c is configured to directly measure a gradient of the magnetic field along the axis 604. A second order gradient sensing element 602d is configured to directly measure a second order gradient of the magnetic field along the axis 604. A vibrational sensing element 602a is also positioned axially with the magnetic field sensing elements and can be utilized to identify vibrational forces which may disrupt other measurements and adjust outputs accordingly. In some arrangements, the vibration sensing element 602a, magnetic field sensing element 602b, first order gradient sensing element 602c, and second order gradient sensing element 602d, can be arranged, sequentially in that order, along the axis 604. All the sensing elements 602 can be packaged in a shared housing 606 to maintain the sensing elements 602 in a fixed position and orientation with respect to one another. While various combinations of the sensing elements can be shown, many arrangements described herein will utilize at least a magnetic field intensity sensing element 602b and a first order magnetic field gradient sensing element 602c.

Other sensing elements, such as for humidity and temperature, may be embedded in the sensor 600 for compensation to improve the integrity of the magnetic signal by making corresponding adjustments to the other measurements taken. In the example shown, a temperature sensing element 602e is embedded in the sensor 600 and can be relied on to make adjustments based on signal drift from high temperatures experienced by the sensor 600.

Thus, the exemplary sensor 600 incorporates many sensing elements 602, designed in accordance with the subject technology, to help compensate for potential errors in the sensor 600 and/or improve measurements for various applications. In one example, the sensor 600 can be used to measure a signal from a human heart. While sensors are typically designed to measure a particular quality, they will also have some sensitivity to other influences. The measurement of the human heart will involve vibrations from the chest, temperature gradients from the warm body, increased humidity (especially during exercise), and many stray magnetic fields and gradients from the environment of the measurement. So, one would include various sensors and/or sensing elements as close to the core magnetic sensing element as possible in order to compensate for those errors. Furthermore, measurement accuracy and/or precision can be improved by measuring additional magnetic content, such as the magnetic gradient in the axis perpendicular to the chest as well as in-plane with the chest. The combination of those two signals would likely yield an improved signal quality.

Knowing all this, one can extrapolate further. The magnetic fields of the heart are extremely three dimensional because the heart is three dimensional, not to mention that the heart physically deforms, translates, and rotates while producing the desired magnetic fields. All of these events, subtle or not, can be captured by various signal derivatives. For example, in some instances, two typical gradient axes (dBxdx and dBzdz) can be measured. In another example, a gradient axis such as dBxdy can be measured. This reads as the change in the x-component of the magnetic field over some distance, y. If x is perpendicular to the chest (a vector towards the heart), and we then measure that field at various points in plane (moving across the chest), we would expect it to change quite a bit. It would probably be a maximum at the two poles of the heart, with a minimum in the middle of the heart and as one gets further away from the heart (e.g. at the shoulder). This means that there are some large dBxdy signals.

To measure these, the sensor 600 includes sensing elements which directly measure magnetic field gradients (i.e. sensing elements 602c, 602d). Responding directly to field gradients is in contrast to other sensors which calculate gradients based on a grid of measurements and assumptions. Therefore the sensing elements 602 used in the sensor 600 can directly measure the gradient (dBxdx for example) or the second order gradient (dB2xdx2). The same goes for arrangements of various magnetic components that the deflection of a physical MEMS components would be proportional to dBxdy. Correspondingly, the location of the sensing elements on a sensing device on a user can be selected to emphasize the gradients being measured.

Various axes need not be combined in all instances either. Time derivatives can be considered as a helpful way to conceptualize other instances. For example, a device such as a smart watch as may be used by a runner. The smart watch is designed to track a runner's position during a cloudy day with no satellites. The satellites typically use the GPS to give great understanding of location via the triangulation of multiple satellites and the different timing of signals going to and from them, but in this example, satellites are unavailable. However, the watch may include sensing elements capable of measuring velocity and acceleration (first order gradient and second order gradient of position). These sensors can be used to estimate position effectively relative to some arbitrary and/or predetermined starting location. This is called "dead reckoning." Applying this analogy to the example of measuring the magnetic field of the heart, labeled B, there are tons of "clouds" in the hospital and in ambient city environments that jam the magnetic environment. But, using, various gradients and other components of the signal, the sensors described herein can back out the original signal of interest.

Referring now to FIGS. 8a-13c, examples are shown where sensors 600 are oriented to form a pattern which emphasizes a direction of interest of the magnetic field being measured. Each sensor 600 within the pattern can include a sensing element or combination of multiple sensing elements as discussed above. The sensor patterns can be three-dimensional, including sensors and/or sensing elements orientated in a particle pattern in three-dimensional space. The exemplary patterns shown herein can be used used for imaging objects that are close or far away, that are spherical and 3D/flat and 2D, that present varying orientations of magnetic gradients, and that present varying anomalies in magnetic, thermal, mechanical, and other domains.

Figure 8A:
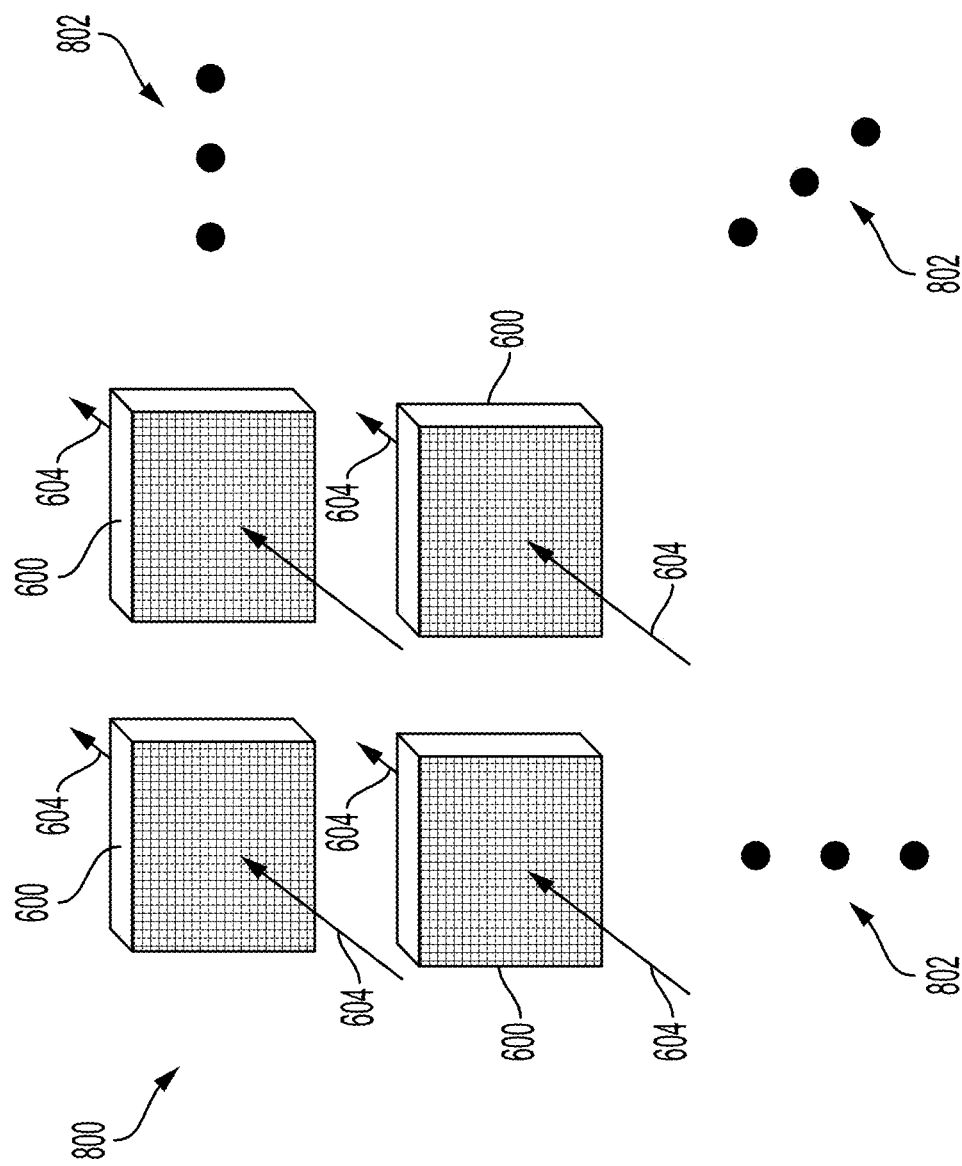
FIGS. 8a-11 are exemplary sensor positions and orientations as part of a sensor pattern in accordance with the subject technology.

Referring now to FIG. 8a, an exemplary pattern 802 using four equally spaced sensors 600 in a 2×2 square is shown. The sensors 600 are oriented to measure a magnetic signal along the direction of the axis 604. As such, the sensors 600 are positioned along a shared plane, and their sensing elements can each be oriented axially along the axis 604 (e.g., as shown in FIG. 7a). The ellipses 802 indicate that other sensors 600 may also be included as part of the pattern, in other arrangements. For example, the pattern could be expanded to include a 3×3 or 4×4 block of sensors 600, or an uneven number of sensors such as a 2×3 or 3×2 arrangement of sensors. Additional sensors 600 could also be included behind or in front of the sensors 600 shown, along the axis 604, to form a three-dimensional pattern.

Figure 8C:
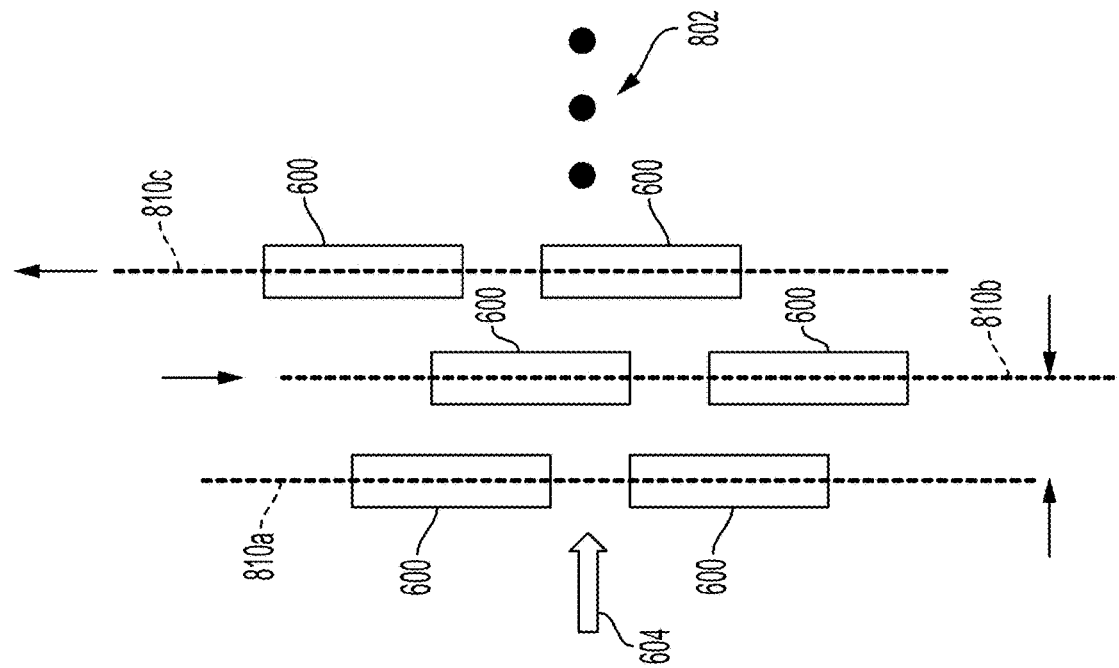
Figure 8B:
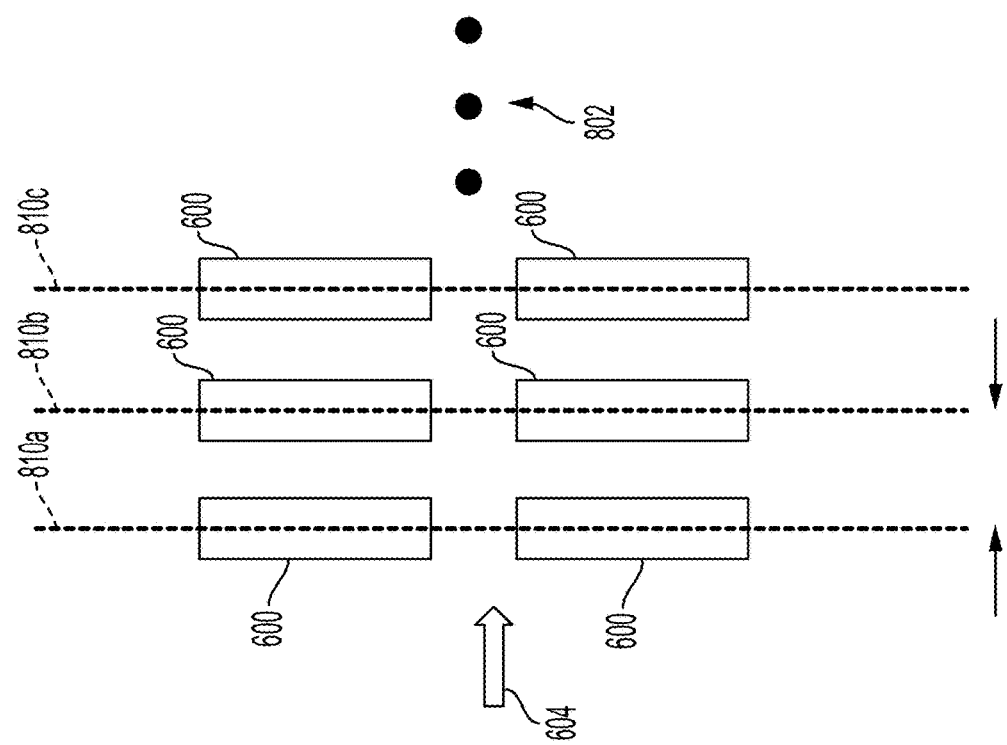

Referring now to FIGS. 8b and 8c, sensor patterns are shown from a side view (as compared to FIG. 8a, which is a front view). In FIGS. 8b and 8c, a number of separate planes 810a, 810b, 810c (generally 810) are shown, which each have a number of sensors 600 with their own sensing elements, oriented to measure along the axis 604. In FIG. 8b, the sensors 600 are oriented such that sensors 600 on separate planes 810 are aligned in the direction of the axis 604. By contrast, the sensors 600 in FIG. 8c are staggered along the axis 604 between different planes 810. Further, while only two sensors 600 are visible on each plane in FIGS. 8b-8c, it should be understood that each plane 810 could include a number of separate sensors 600 as shown and described with respect to FIG. 8a. For example, the sensor pattern could include a 2×2 box of sensors 600 on each plane 810, as shown in FIG. 8a, across three separate planes 810 as shown in FIGS. 8b and 8c. Each sensor 600 can also include a number of sensing elements, as described herein. Again, these arrangements are only exemplary and the ellipses 802 denote that additional sensors 600 could be included on further planes, in addition to those shown herein.

Referring now to FIGS. 9a-9d, additional sensor patterns are shown. The sensors 600 are shown from a side view, and are shown oriented along two different axes 910a, 910b (generally 910). In the orientation shown, one axis 910a runs horizontally while another axis 910b runs vertically. The arrangement of FIGS. 9a-9d includes two sensors 600 elongated along each axis 910a, 910b, such that the sensor pairs run orthogonal to the sensor pairs of the other axis. It should be understood that additional sensors 600 could be included as part of the pattern, substantially similar to the pattern shown, spaced directly behind the sensors shown (i.e. behind the sensors 600 shown along an axis perpendicular to the plane formed by the axes 910a, 910b).

Figure 9C:
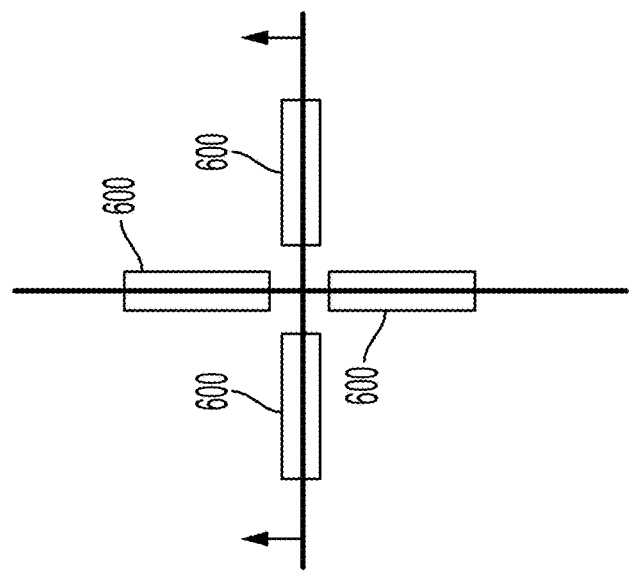
Figure 9B:
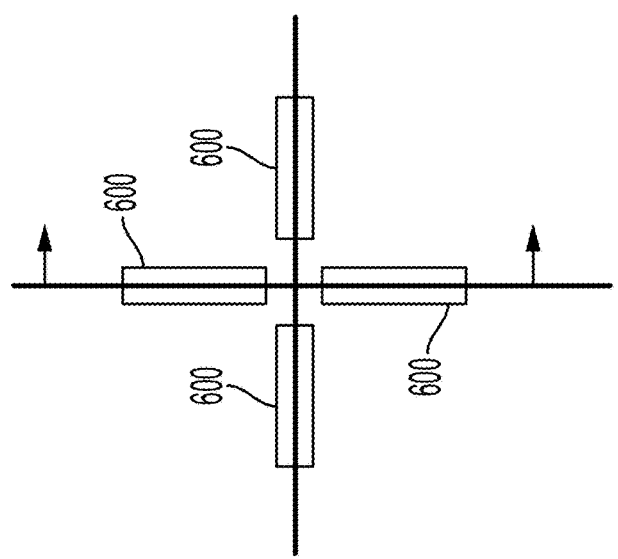
Figure 9A:
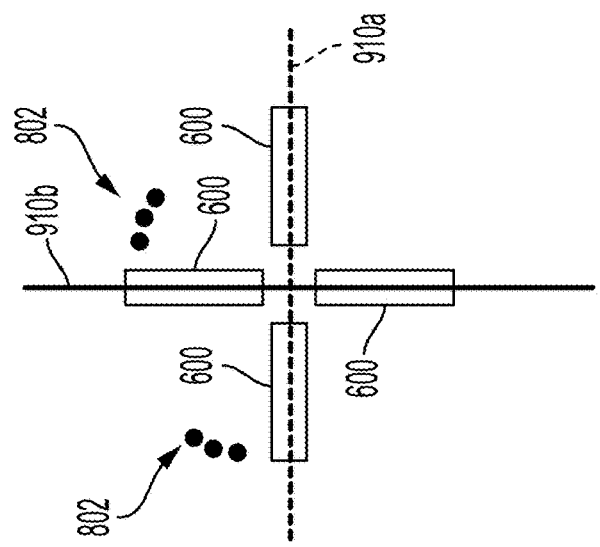
Figure 9D:
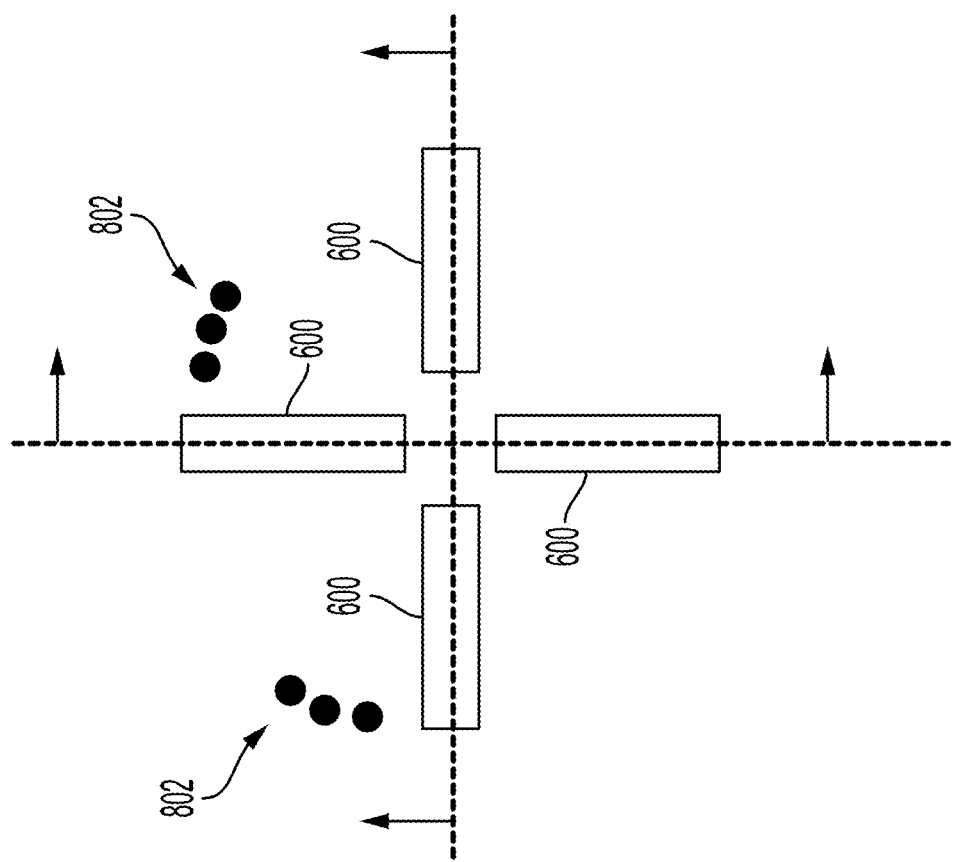
Figure 10:
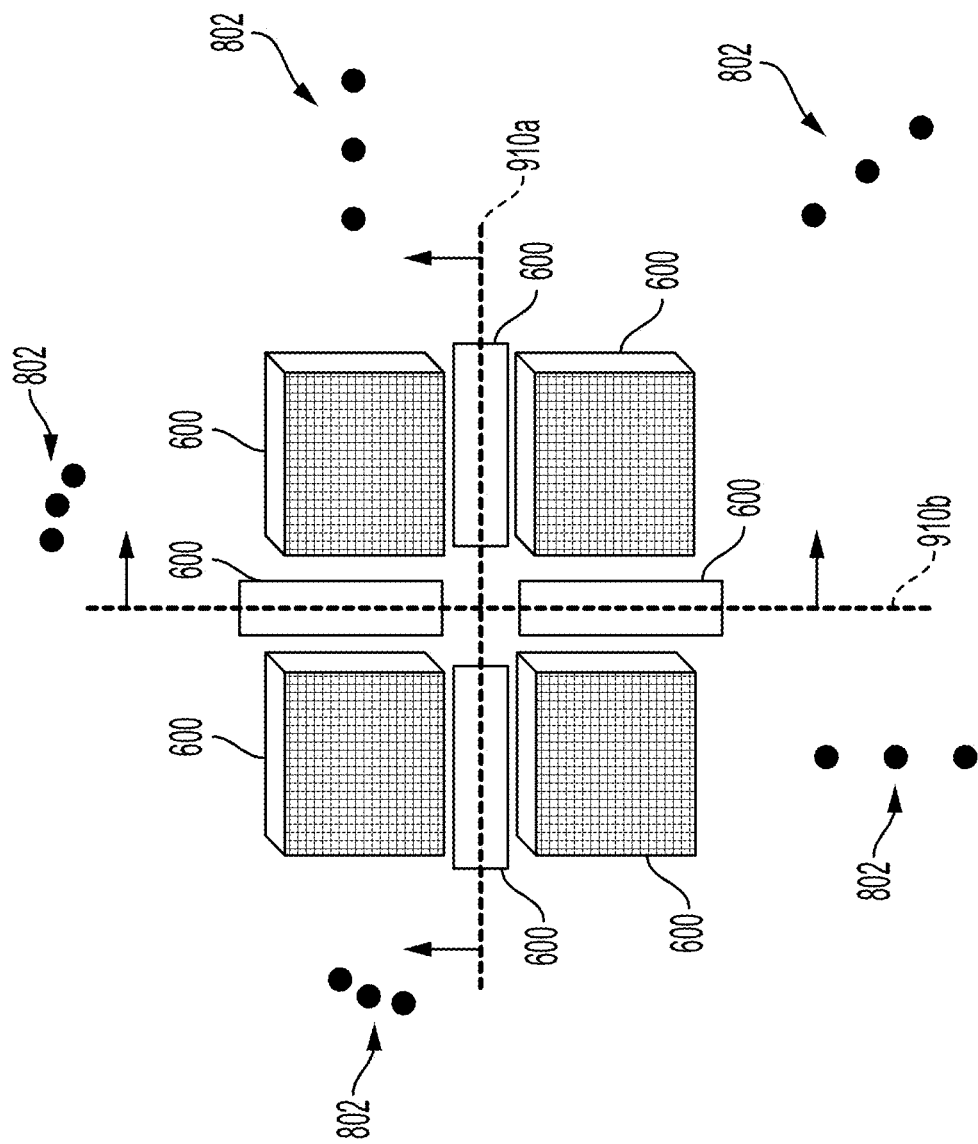

Referring now to FIG. 10, an exemplary sensor pattern is shown which combines arrangements similar to those shown in FIGS. 8a and 9a. In particular, two sensors 600 are shown from the side (in the orientation shown) with sensor pairs aligned along each of the two axes shown 910a, 910b. Four additional evenly spaced front facing sensors 600 are oriented parallel along the plane formed by the axes 910a, 910b. Thus, this pattern includes sensors facing in the direction of substantially all three-dimensional axes. It should be understood that this pattern could also repeat on further plane(s) behind the one shown.

Figure 11:
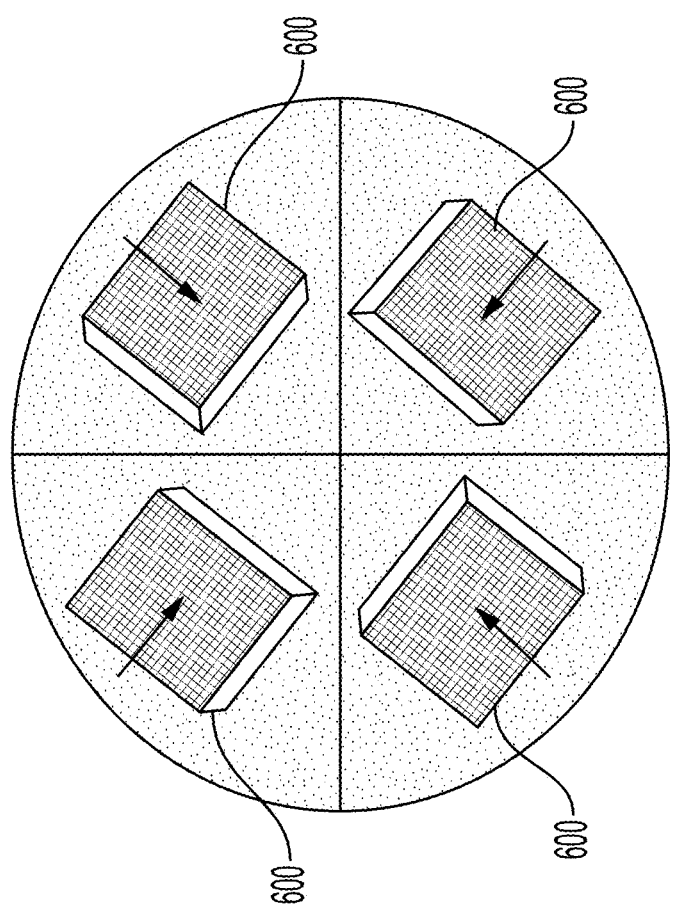
Figure 12C:
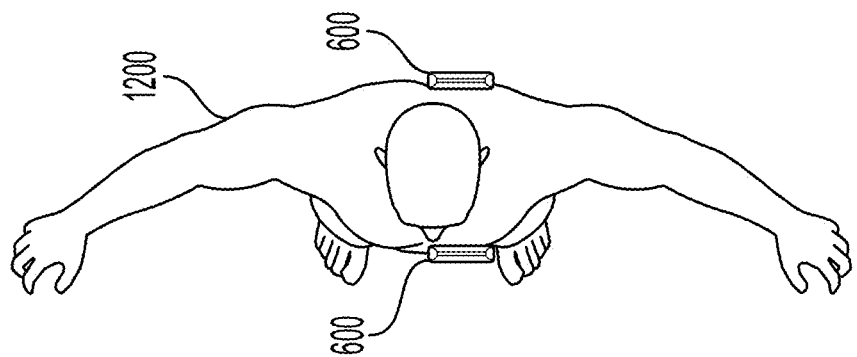
FIGS. 12a-12c are views of an exemplary pattern of sensors and sensing elements on an individual, in accordance with the subject technology.
Figure 12B:
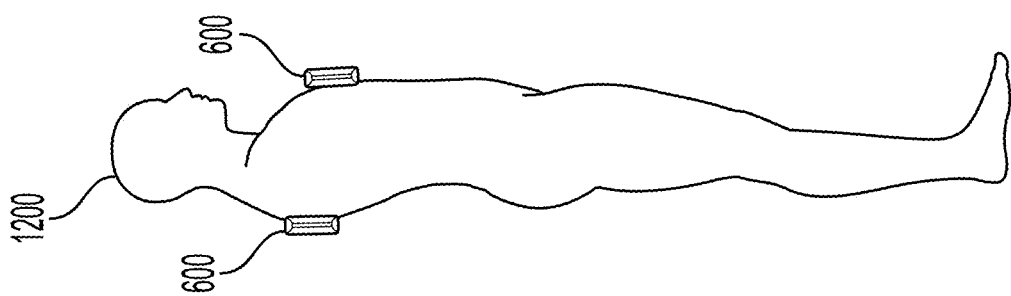
Figure 12A:
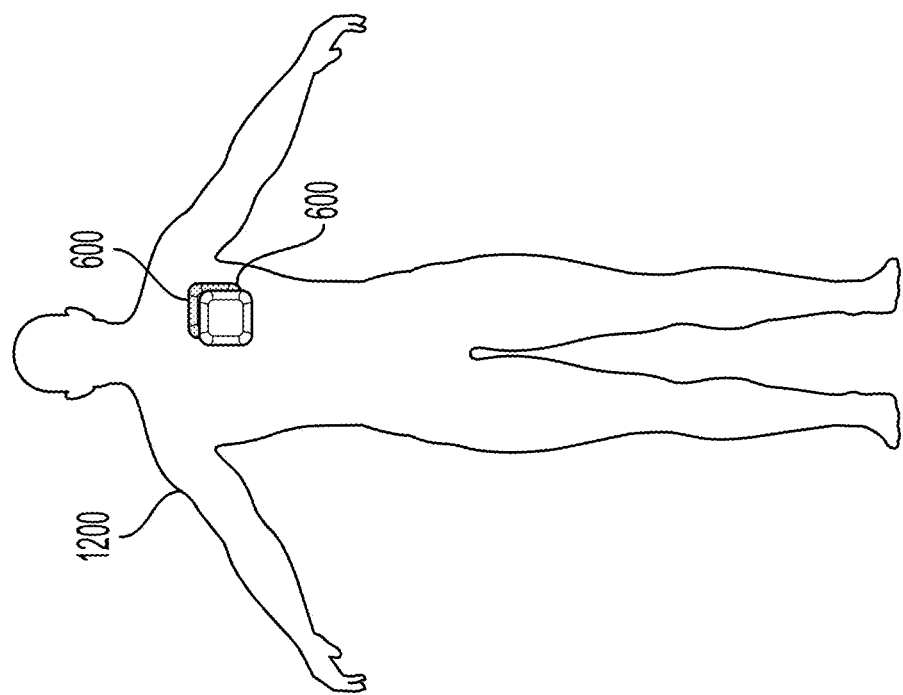
Figure 13C:
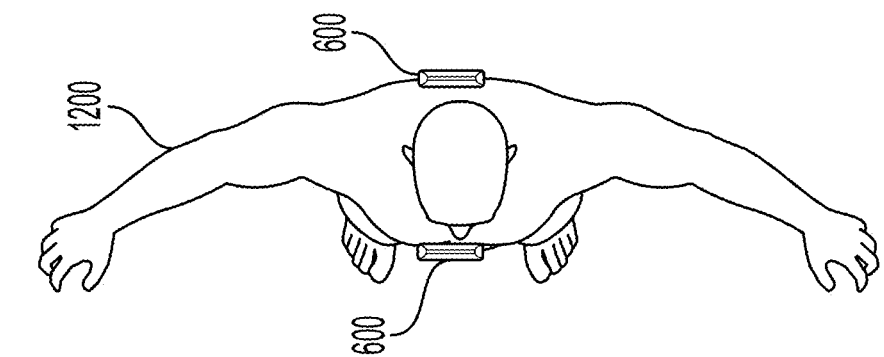
FIGS. 13a-13c are views of another exemplary pattern of sensors and sensing elements on an individual, in accordance with the subject technology.
Figure 13B:
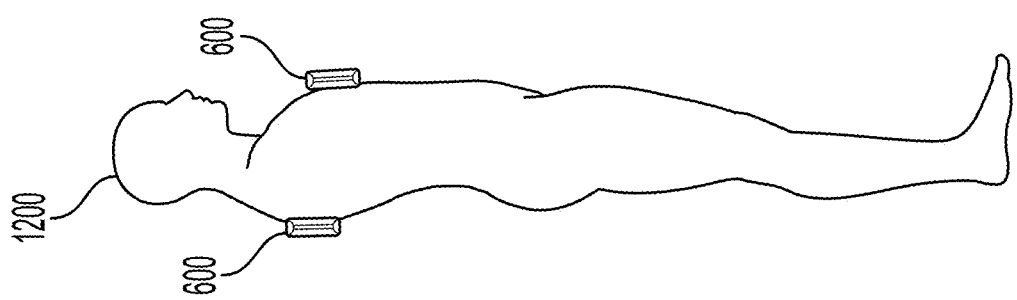
Figure 13A:
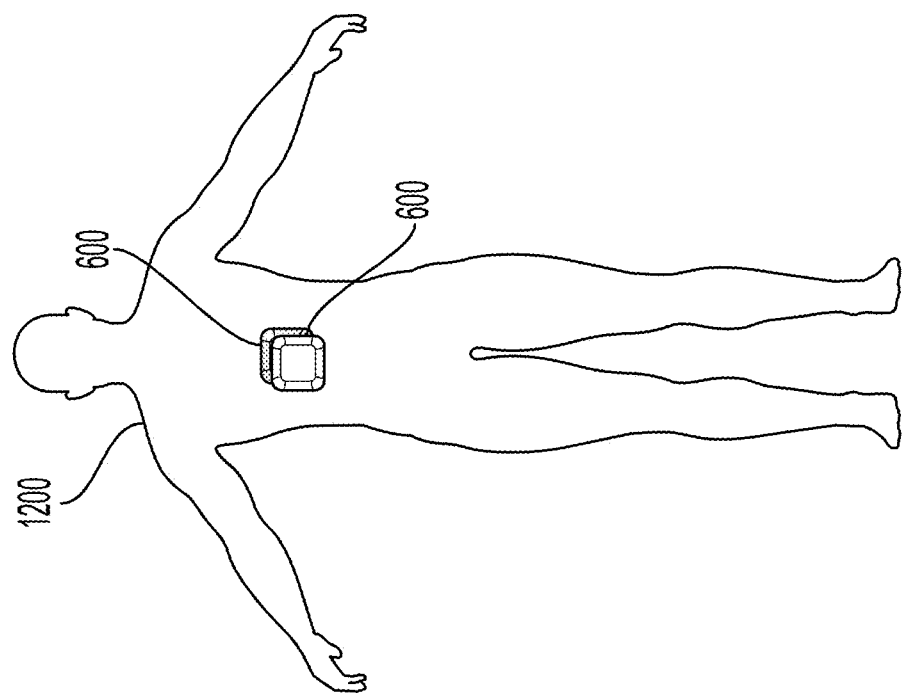

Referring now to FIG. 11, another exemplary sensor pattern is shown. The sensors 600 of FIG. 11 are arranged in an arcuate shape, such as around the exterior of a sphere, rather than along a plane as with other sensor arrangements shown herein. Each sensor 600 can therefore be oriented to emphasize forces in a particular direction, such as in an axis running perpendicular to the face of the sensor 600. Further sensors 600 could also be included along the arcuate exterior shape of the sphere.

Referring now to FIGS. 12a-13c, another pattern of sensors 600 is shown, positioned on an exemplary person 1200 to measure the magnetic field of the person's heart, as described elsewhere herein. In the arrangements shown, a first sensor 600 is positioned on the user's chest, in an area where a magnetic field of the heart is greatest in one direction. A corresponding sensor 600 is arranged, axially, or slightly off axis, from the first sensor 600 on the user's back. Together, these sensors 600 can measure the magnetic field in a desired direction, while isolating other forces acting off-axis. In general, the sensor pattern shown in FIGS. 12a-12c can correspond to the location of sensor 500 in FIG. 5c, where in-plane magnetic field or magnetic field gradients are emphasized (e.g. Bxy). The sensor pattern shown in FIGS. 13a-13c can correspond to the location of the sensor 500 in FIG. 5b where out of plane magnetic field or field gradients are emphasized (e.g. Bz).

All references cited herein are incorporated by reference, as though fully set forth herein. All orientations and arrangements of the components shown herein are used by way of example only. Further, it will be appreciated by those of ordinary skill in the pertinent art that the functions of several elements may, in alternative embodiments, be carried out by fewer elements or a single element. Similarly, in some embodiments, any functional element may perform fewer, or different, operations than those described with respect to the illustrated embodiment. Also, functional elements shown as distinct for purposes of illustration may be incorporated within other functional elements in a particular implementation.

While the subject technology has been described with respect to preferred embodiments, those skilled in the art will readily appreciate that various changes and/or modifications can be made to the subject technology without departing from the spirit or scope of the subject technology. For example, each claim may depend from any or all claims in a multiple dependent manner even though such has not been originally claimed.

What is claimed is:

1. A method of measuring a magnetic field from a source, comprising:
   providing a plurality of sensors each including a plurality of sensing elements, the sensing elements comprising at least a first sensing element configured to detect an intensity of the magnetic field and a second sensing element configured to directly measure a gradient of the magnetic field;
   determining a position, with respect to the source, where a magnitude of the magnetic field in a first direction is greatest;
   determining an orientation of the sensors in a three-dimensional pattern by arranging the sensors to emphasize sensing the magnetic field in the first direction;
   orienting and positioning the sensors according to the position and orientation determined; and
   measuring the magnetic field in the first direction using the sensors;
   wherein the three-dimensional pattern includes at least four sensors along a plane, each sensor including a plurality of sensing elements aligned along an axis perpendicular to the plane.

2. The method of claim 1, wherein each of the sensors includes at least the following:
   a vibrational sensing element configured to detect vibration on the sensor; and
   a third sensing element configured to directly measure a second order gradient of the magnetic field.

3. The method of claim 2, wherein the vibrational sensing element, the first sensing element, the second sending element, and the third sensing element are aligned, and positioned sequentially along an axis.

4. The method of claim 1, wherein the four sensors along the plane are evenly spaced and form a two-by-two square.

5. The method of claim 4, wherein the plane is formed from a first axis and a second axis orthogonal to the first axis, wherein:
   the first axis includes a first sensor pair aligned along the first axis and oriented towards a direction orthogonal to the direction of the four sensors along the plane; and
   the second axis includes a second sensor pair aligned along the second axis and oriented towards a direction orthogonal to both the direction of the four sensors along the plane and the direction of the first sensor pair.

6. The method of claim 1, wherein the sensors include at least two sensors on opposite sides of the source, wherein the magnetic field measured is an in-plane magnetic field of the source.

7. The method of claim 1, wherein the sensors include at least two sensors on opposite sides of the source, wherein the magnetic field measured is an out of plane magnetic field of the source.

8. The method of claim 1, wherein each sensor also includes a temperature sensing element, the method further comprising adjusting a signal of the measured magnetic field to account for signal drift due to temperature of the sensor.

9. The method of claim 1, wherein each sensor also includes a humidity sensing element, the method further comprising adjusting a signal of the measured magnetic field to account for humidity.

10. A system for measuring a magnetic field from a source, comprising:
    a plurality of sensors each including a plurality of sensing elements, the sensing elements comprising at least a first sensing element configured to detect an intensity of the magnetic field and a second sensing element configured to directly measure a gradient of the magnetic field, wherein:
    the sensors are positioned, with respect to the source, where a magnitude of the magnetic field in a first direction is greatest;

the sensors are oriented in a three-dimensional pattern which emphasizes sensing the magnetic field in the first direction;

the system is configured to measure the magnetic field in the first direction using the sensors; and the three-dimensional pattern includes at least four sensors along a plane, each sensor including a plurality of sensing elements aligned along an axis perpendicular to the plane.

11. The system of claim 10, wherein each of the sensors includes at least the following:

a vibrational sensing element configured to detect vibration on the sensor; and a third sensing element configured to directly measure a second order gradient of the magnetic field.

12. The system of claim 11, wherein the vibrational sensing element, the first sensing element, the second sending element, and the third sensing element are aligned, and positioned sequentially along an axis.

13. The system of claim 10, wherein the four sensors along the plane are evenly spaced and form a two-by-two square.

14. The system of claim 13, wherein the plane is formed from a first axis and a second axis orthogonal to the first axis, wherein:

the first axis includes a first sensor pair aligned along the first axis and oriented towards a direction orthogonal to the direction of the four sensors along the plane; and the second axis includes a second sensor pair aligned along the second axis and oriented towards a direction orthogonal to both the direction of the four sensors along the plane and the direction of the first sensor pair.

15. The system of claim 10, wherein the sensors include at least two sensors on opposite sides of the source, wherein the magnetic field measured is an in-plane magnetic field of the source.

16. The system of claim 10, wherein the sensors include at least two sensors on opposite sides of the source, wherein the magnetic field measured is an out of plane magnetic field of the source.

17. The system of claim 10, wherein each sensor also includes a temperature sensing element, the method further comprising adjusting a signal from the measured magnetic field to account for signal drift due to temperature of the sensor.

18. The system of claim 10, wherein each sensor also includes a humidity sensing element, the method further comprising adjusting a signal from the measured magnetic field to account for humidity.

* * * * *